US012456706B2

(12) United States Patent
Cok et al.

(10) Patent No.: US 12,456,706 B2
(45) Date of Patent: Oct. 28, 2025

(54) VARIABLE STIFFNESS MODULES

(71) Applicants: X-Celeprint Limited, Dublin (IE); LEONHARD KURZ Stiftung & Co. KG, Fürth (DE)

(72) Inventors: Ronald S. Cok, Rochester, NY (US); Gabriele Roithmeier, Nuremberg (DE); Christian Schulz, Fürth (DE); Michael Scharfenberg, Nuremberg (DE)

(73) Assignees: X-Celeprint Limited, Dublin (IE); LEONHARD KURZ Stiftung & Co. KG, Fürth (DE)

( * ) Notice: Subject to any disclaimer, the term of this patent is extended or adjusted under 35 U.S.C. 154(b) by 721 days.

(21) Appl. No.: 17/637,913

(22) PCT Filed: Aug. 24, 2020

(86) PCT No.: PCT/EP2020/073651
§ 371 (c)(1),
(2) Date: Feb. 24, 2022

(87) PCT Pub. No.: WO2021/037808
PCT Pub. Date: Mar. 4, 2021

(65) Prior Publication Data
US 2022/0285309 A1 Sep. 8, 2022

Related U.S. Application Data

(60) Provisional application No. 62/891,917, filed on Aug. 26, 2019.

(51) Int. Cl.
*H01L 21/48* (2006.01)
*H01L 23/00* (2006.01)
(Continued)

(52) U.S. Cl.
CPC .......... *H01L 24/40* (2013.01); *H01L 21/4857* (2013.01); *H01L 23/49833* (2013.01);
(Continued)

(58) Field of Classification Search
CPC ........ H05K 3/301; H05K 1/0274; H05K 1/89; H05K 1/0271; H01L 21/4857;
(Continued)

(56) References Cited

U.S. PATENT DOCUMENTS 4,977,441 A 12/1990 Ohtani et al.
5,308,342 A 5/1994 Sepetka et al.
(Continued)

FOREIGN PATENT DOCUMENTS

CN 101604643 A 12/2009
CN 102484120 A 5/2012
(Continued)

OTHER PUBLICATIONS

International Search Report for PCT/EP2020/073651, filed Aug. 24, 2020, 10 pages, (Apr. 15, 2021).
(Continued)

*Primary Examiner* — Alonzo Chambliss
(74) *Attorney, Agent, or Firm* — Choate, Hall & Stewart LLP; Michael D. Schmitt

(57) ABSTRACT

A variable-stiffness module includes a rigid structure having a first stiffness, an intermediate substrate having a second stiffness less than the first stiffness, and a flexible substrate having a third stiffness less than the second stiffness. The rigid structure is disposed on the intermediate substrate and the intermediate substrate is disposed on the flexible substrate. A conductor is disposed partially on the intermediate substrate and partially on the flexible substrate and is connected to the rigid structure. The conductor extends from the rigid structure to the intermediate substrate to the flexible
(Continued)

substrate. In some embodiments, a variable-stiffness module includes any combination of multiple rigid structures, multiple intermediate substrates, and multiple conductors. The conductor can be an optical conductor or an electrical conductor and can be disposed over the rigid structure or between the rigid structure and the intermediate substrate.

15 Claims, 20 Drawing Sheets

(51) Int. Cl.
H01L 23/498 (2006.01)
H01L 25/065 (2023.01)
H01L 25/16 (2023.01)
H05K 1/02 (2006.01)
H05K 1/18 (2006.01)
H05K 3/30 (2006.01)

(52) U.S. Cl.
CPC ........ *H01L 23/4985* (2013.01); *H01L 23/562* (2013.01); *H01L 24/16* (2013.01); *H01L 24/24* (2013.01); *H01L 24/72* (2013.01); *H01L 25/0655* (2013.01); *H01L 25/167* (2013.01); *H05K 1/0271* (2013.01); *H05K 1/0274* (2013.01); *H05K 1/189* (2013.01); *H05K 3/301* (2013.01); *H01L 2224/40095* (2013.01); *H01L 2224/40228* (2013.01)

(58) Field of Classification Search
CPC ............... H01L 23/4985; H01L 23/562; H01L 23/49833; H01L 24/40; H01L 24/72; H01L 24/16; H01L 24/24; H01L 25/167; H01L 25/0655; H01L 2224/40095; H01L 2224/83192
See application file for complete search history.

(56) References Cited

U.S. PATENT DOCUMENTS

| 5,811,317 | A | 9/1998 | Maheshwari et al. |
| 6,195,260 | B1 | 2/2001 | Moriyama |
| 6,355,027 | B1 | 3/2002 | Le et al. |
| 6,579,277 | B1 | 6/2003 | Rabiner et al. |
| 7,622,367 | B1 | 11/2009 | Nuzzo et al. |
| 8,506,867 | B2 | 8/2013 | Menard |
| 8,889,485 | B2 | 11/2014 | Bower |
| 10,468,363 | B2 | 11/2019 | Prevatte et al. |
| 2002/0119605 | A1* | 8/2002 | Lunceford ............ H01L 21/563 257/E23.125 |
| 2004/0217488 | A1* | 11/2004 | Luechinger .......... B23K 20/008 257/784 |
| 2005/0146005 | A1* | 7/2005 | Shimoishizaka ....... H01L 24/91 257/E29.022 |
| 2005/0194694 | A1* | 9/2005 | Takahashi ............... H01L 25/50 257/777 |
| 2007/0183184 | A1 | 8/2007 | Nakamura et al. |
| 2009/0065902 | A1* | 3/2009 | Yu ....................... H01L 25/0657 257/E29.022 |
| 2011/0043105 | A1 | 2/2011 | Cok et al. |
| 2012/0182083 | A1 | 7/2012 | Kikuchi et al. |
| 2012/0313241 | A1 | 12/2012 | Bower |
| 2014/0091335 | A1* | 4/2014 | Satake ..................... F21V 17/10 257/88 |
| 2015/0069132 | A1* | 3/2015 | Pueschner ............... H01L 21/56 235/488 |
| 2015/0221586 | A1* | 8/2015 | Paek ....................... H01L 24/49 257/668 |
| 2015/0282321 | A1 | 10/2015 | Aleksov et al. |
| 2016/0064299 | A1* | 3/2016 | Lakhera ................. H01L 21/78 438/126 |
| 2017/0047303 | A1 | 2/2017 | Meitl et al. |
| 2017/0147852 | A1 | 5/2017 | Benkley, III et al. |
| 2018/0107244 | A1 | 4/2018 | Fujie et al. |
| 2018/0279467 | A1 | 9/2018 | Kamakura |
| 2019/0280040 | A1 | 9/2019 | Cheng et al. |

FOREIGN PATENT DOCUMENTS

| CN | 104952826 | A | 9/2015 |
| CN | 105977277 | A | 9/2016 |
| CN | 106340523 | A | 1/2017 |
| CN | 108493201 | A | 9/2018 |
| CN | 108541319 | A | 9/2018 |
| EP | 1028463 | A1 | 8/2000 |
| EP | 1635387 | A1 | 3/2006 |
| JP | H11-163475 | A | 6/1999 |
| JP | 2000-114433 | A | 4/2000 |
| JP | 2001188146 | A | 7/2001 |
| JP | 2008-084968 | A | 4/2008 |
| JP | 2018-160575 | A | 10/2018 |
| WO | WO-2001/030123 | A1 | 4/2001 |
| WO | WO-2013/118217 | A1 | 8/2013 |
| WO | WO-2019/142423 | A1 | 7/2019 |

OTHER PUBLICATIONS

Written Opinion for PCT/EP2020/073651, filed Aug. 24, 2020, 30 pages, (Apr. 15, 2021).

* cited by examiner

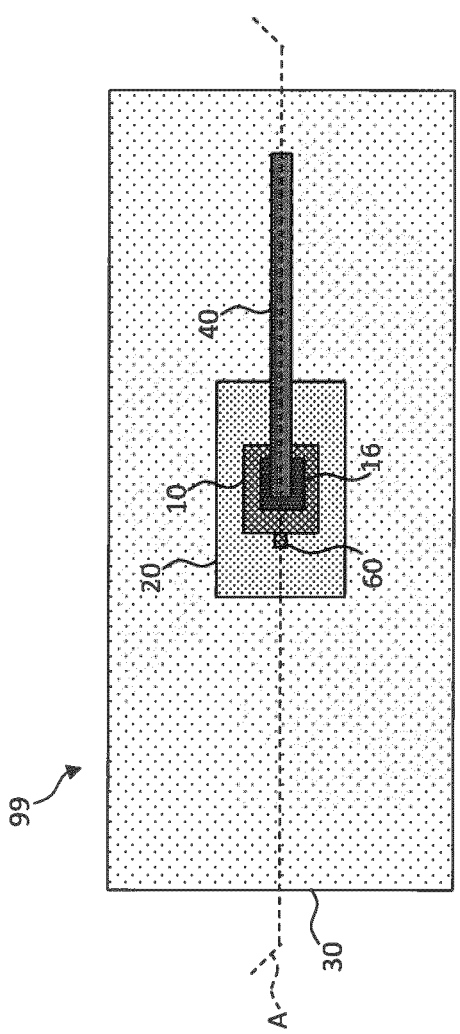
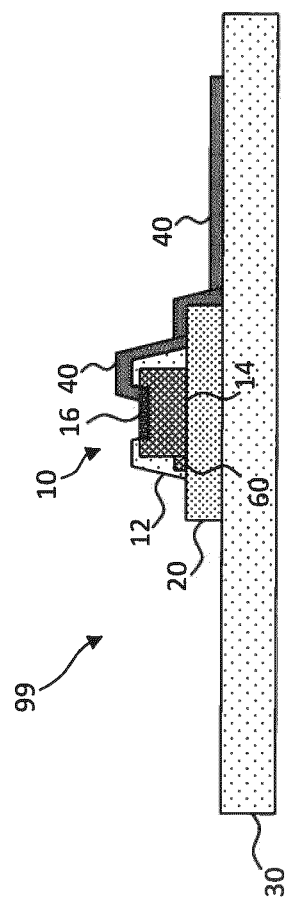
FIG. 1A
FIG. 1B

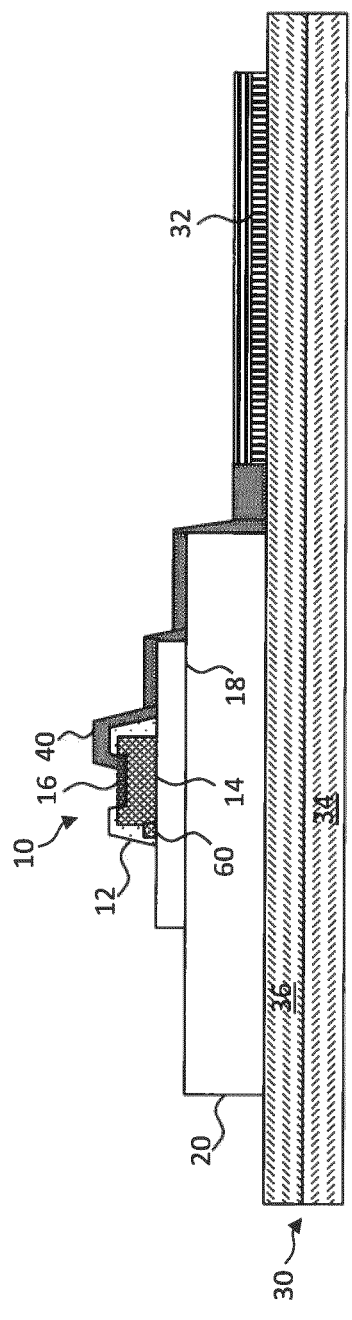
FIG. 5
FIG. 6A
FIG. 6B

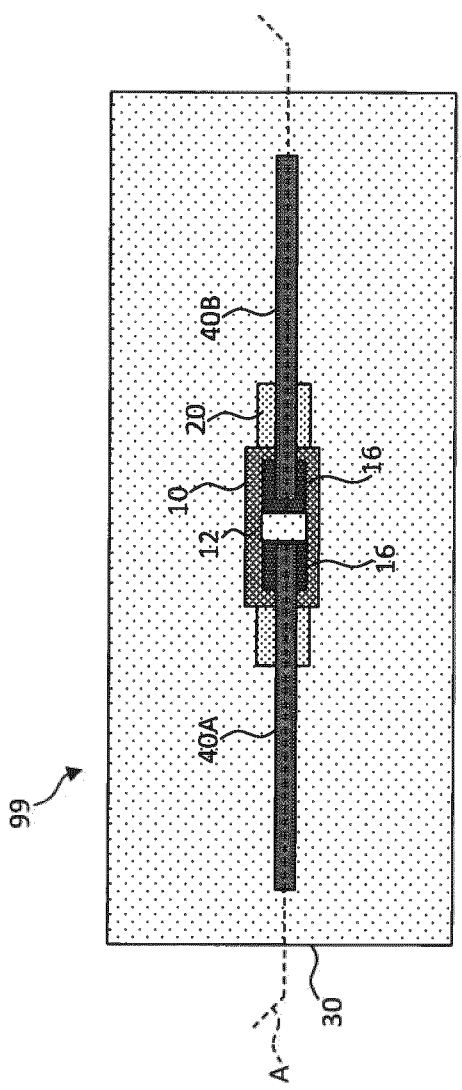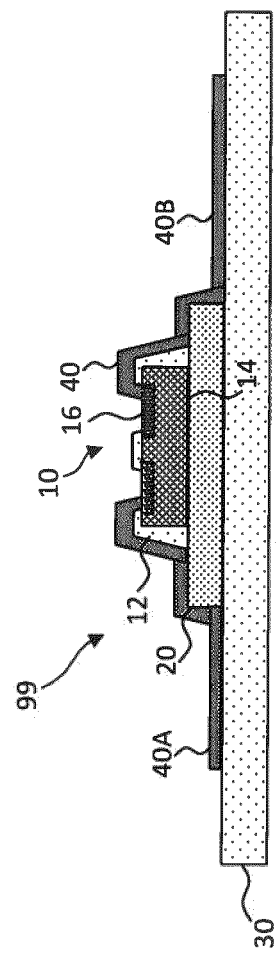
FIG. 7A
FIG. 7B

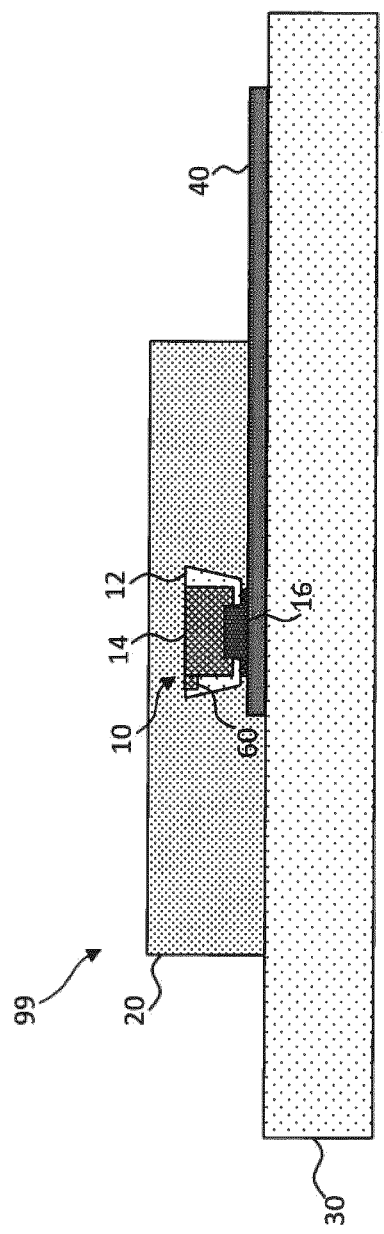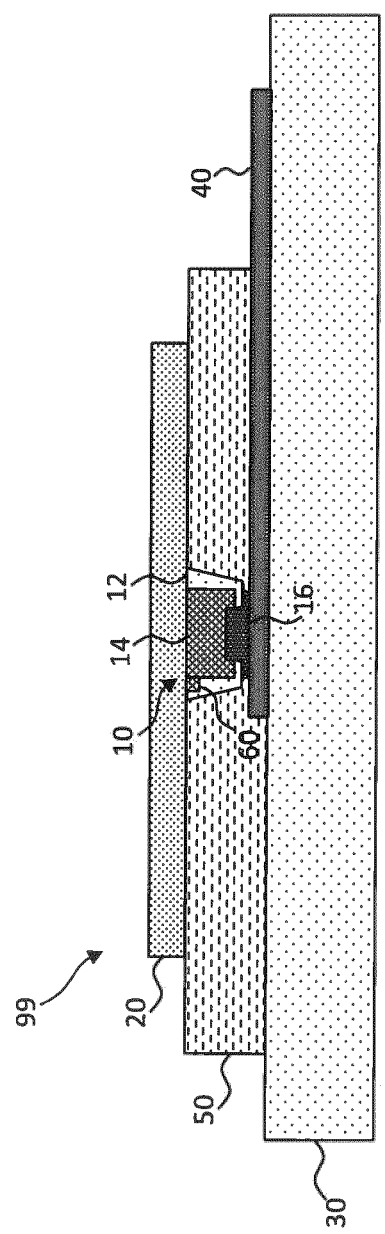

VARIABLE STIFFNESS MODULES

TECHNICAL FIELD

The present disclosure relates generally to transfer printed structures comprising multiple substrates of different stiffness.

BACKGROUND

Micro-transfer printing enables the assembly of microscopic devices from a variety of different sources onto a common substrate. The common substrate can be rigid or flexible, can be transparent or opaque, or can have a variety of other characteristics and can comprise a variety of different materials, for example, crystalline or amorphous materials or semiconductor, metal, dielectric, or polymer materials. Micro-transfer-printed devices in a system can be interconnected, for example with electrical conductors.

Micro-transfer printed devices can be rigid and, when disposed on a flexible substrate, can be subject to mechanical stress when the substrate is flexed. Likewise, interconnections disposed on a flexible substrate can be stressed when the substrate is flexed, particularly at physical connections between a rigid device and an interconnection disposed on the flexible substrate.

Structures employing a variable stiffness are used, for example in medical devices such as endoscopes and catheters, for example as taught in U.S. Pat. Nos. 6,579,277, 6,355,027, and 5,308,342. However, there remains a need for structures that reduce stress in systems comprising rigid devices and flexible substrates.

SUMMARY

In certain embodiments of the present disclosure, a variable-stiffness module comprises a rigid structure having a first stiffness, an intermediate substrate having a second stiffness less than the first stiffness, and a flexible substrate having a third stiffness less than the second stiffness. The rigid structure is disposed on the intermediate substrate and the intermediate substrate is disposed on the flexible substrate. A conductor is disposed partially on the intermediate substrate and partially on the flexible substrate and is connected to the rigid structure so that the conductor extends from the rigid structure to the intermediate substrate to the flexible substrate.

In some embodiments, a variable-stiffness module comprises any combination of multiple rigid structures, multiple intermediate substrates, and multiple conductors. In some embodiments, the intermediate substrate is a first intermediate substrate and the module further comprises a second intermediate substrate having a fourth stiffness less than the second stiffness and greater than the third stiffness. The second intermediate substrate is disposed on the flexible substrate and the first intermediate substrate is disposed on the second intermediate substrate. The conductor extends from rigid structure to the first intermediate substrate to the second intermediate substrate to the flexible substrate. In some embodiments, the rigid structure is a first rigid structure and the module further comprises a second rigid structure having a fourth stiffness greater than at least one of the second stiffness and the third stiffness. The second rigid structure is disposed on the flexible substrate and the conductor extends from the first rigid structure to the second rigid structure. The first rigid structure and the second rigid structure can be disposed on the intermediate substrate. According to some embodiments, the second rigid structure is disposed on a second intermediate substrate different from the intermediate substrate.

The conductor can be, for example, an optical conductor or an electrical conductor.

The rigid structure can comprise any one or more of a semiconductor substrate, a glass substrate, a plastic substrate, a polymer substrate, and a metal substrate. The rigid structure can comprise an electrical component, an optical component, or an electro-optical component. The rigid structure can comprise a laser, a light-emitting diode, or a photo-sensor. The rigid structure can comprise one or more broken or separated tethers.

The rigid structure can be disposed at least partly between the conductor and the flexible substrate or at least partly between the conductor and the intermediate substrate. The conductor can be disposed at least partly between the rigid structure and the flexible substrate or the intermediate substrate.

According to some embodiments of the present disclosure, the rigid structure comprises one or more connection posts, a portion of the conductor is disposed between the rigid structure and the intermediate substrate, and at least one of the one or more connection posts is electrically connected to the conductor.

The variable-stiffness module can comprise a power supply disposed on the flexible substrate electrically connected to the electrical conductor. The flexible substrate can comprise at least a portion of a power supply electrically connected to the electrical conductor. The power supply can be a tribo-electric power supply, a piezo-electric power supply, or a photo-voltaic power supply. The power supply can be connected (e.g., electrically connected) to the conductor. According to some embodiments, an external power supply is connected to the electrical conductor, optionally via direct conductive connection or via inductive connection.

According to some embodiments, the flexible substrate comprises a first flexible layer comprising a first material and a second flexible layer comprising a second material different from the first material. The second flexible layer is disposed over or laminated to the first flexible layer. The flexible substrate can comprise a polymer or paper, and can be a banknote, a portion of a banknote, a document, or a portion of a document.

The intermediate substrate can comprise a polymer or paper. One or more of the intermediate substrate and the flexible substrate can have a variable stiffness. The variable stiffness can vary over the physical extent of the intermediate or flexible substrates. One or more of the intermediate substrate and the flexible substrate can have one or more of a variable thickness, a variable material quantity, a variable material composition, and a variable material density.

According to some embodiments of the present disclosure, the rigid structure can be disposed entirely on the intermediate substrate, the intermediate substrate can be disposed entirely on the flexible substrate, or both. According to some embodiments of the present disclosure, the rigid structure is disposed only partly on the intermediate substrate, the intermediate substrate is disposed only partly on the flexible substrate, or both. The intermediate substrate can extend beyond the rigid structure in a direction parallel to a surface of the intermediate substrate, the flexible substrate can extend beyond the intermediate substrate in a direction parallel to a surface of the flexible substrate, or both. The rigid structure can have a first planar extent, the intermediate substrate can have a second planar extent greater than the first planar extent, and the flexible substrate can have a third planar extent greater than the second planar extent.

According to some embodiments, the intermediate substrate comprises a protrusion or extension that extends from an intermediate substrate body in a direction in which the conductor extends. The intermediate substrate protrusion or extension can have a smaller area than an intermediate substrate body and have a width that is less than a width of an intermediate substrate body in a width direction orthogonal to the length direction in which the intermediate substrate protrusion or extension, or the conductor, extends from the intermediate substrate body.

According to some embodiments of the present disclosure, the conductor is a first conductor and the module comprises a second conductor. The second conductor is connected to the rigid structure and extends from the rigid structure to the intermediate substrate to the flexible substrate. In some embodiments, the second conductor is disposed at least partially on a side of the rigid structure opposite the first conductor, the second conductor is disposed at least partially on a same side of the rigid structure as the first conductor, either one or both of the first and second conductors are disposed at least partially between the rigid structure and the intermediate substrate, or either one or both of the first and second conductors are disposed at least partially on a same side of the rigid structure opposite the intermediate substrate. In some embodiments, the first conductor is an electrical conductor and the second conductor is an optical conductor.

According to some embodiments of the present disclosure, a method of making a variable-stiffness module comprises providing a rigid structure having a first stiffness, providing an intermediate substrate having a second stiffness less than the first stiffness, providing a flexible substrate having a third stiffness less than the second stiffness, disposing the rigid structure on the intermediate substrate and disposing the intermediate substrate on the flexible substrate, disposing a conductor partially on the intermediate substrate and partially on the flexible substrate, and connecting the rigid structure to the conductor so that the conductor extends from the rigid structure to the intermediate substrate to the flexible substrate.

In some embodiments, a method comprises disposing the rigid structure onto or over the conductor to make a connection between the rigid structure and the conductor. In some embodiments, a method comprises disposing the conductor partially on the rigid structure. In some embodiments, a method comprises micro-transfer printing the rigid structure partially on the intermediate substrate. In some embodiments, a method comprises adhering a pre-formed conductor to one or more of the rigid structure, the intermediate substrate, and the flexible substrate.

According to some embodiments of the present disclosure, a variable-stiffness module comprises a rigid structure having a first stiffness, a support structure having a variable stiffness, wherein a portion of the support structure has a local stiffness less than the first stiffness, wherein the rigid structure is disposed on the portion of the support structure, and a conductor disposed on the rigid structure and on the support structure, the conductor extending from the rigid structure to the support structure. The rigid structure can be disposed at least partly between the conductor and the support structure. The conductor can be disposed at least partly between the rigid structure and the support structure. According to some embodiments, the rigid structure comprises one or more connection posts, the conductor is disposed between the rigid structure and the support structure, and at least one of the one or more connection posts is connected to the conductor. The rigid structure can have an area that is smaller than an area of the flexible substrate. The conductor can be an optical conductor or an electrical conductor.

According to some embodiments of the present disclosure, the rigid structure can comprise an electrically conductive spike in electrical contact with the conductor.

According to some embodiments of the present disclosure, the rigid structure is disposed between the intermediate substrate and the flexible substrate. The rigid structure can be at least partially surrounded by a void.

According to some embodiments of the present disclosure, the intermediate substrate is a first intermediate substrate and the variable-stiffness module further comprises a second intermediate substrate having a fourth stiffness less than the second stiffness and greater than the third stiffness, wherein the second intermediate substrate is disposed on the flexible substrate and the first intermediate substrate is disposed on the second intermediate substrate, and the rigid structure is at least partially disposed in the second intermediate substrate.

According to some embodiments of the present disclosure, a variable-stiffness module comprises a rigid structure having a first stiffness, an intermediate substrate having a second stiffness less than the first stiffness, wherein the rigid structure is disposed on the intermediate substrate, a flexible substrate having a third stiffness less than the second stiffness, wherein the intermediate substrate is disposed on the flexible substrate, and a conductor disposed at least partially on the flexible substrate and connected to the rigid structure. The rigid structure can comprise an electrically conductive spike in electrical contact with the conductor. The rigid structure can be disposed at least partially between the intermediate substrate and the flexible substrate. The variable-stiffness module can comprise a void at least partially surrounding the rigid structure. The intermediate substrate can be a first intermediate substrate and the module further can comprise a second intermediate substrate having a fourth stiffness less than the second stiffness and greater than the third stiffness, wherein the second intermediate substrate is disposed between the flexible substrate and the first intermediate substrate. The first intermediate substrate can extend over a first portion of the flexible substrate, the second intermediate substrate can extend over a second portion of the flexible substrate, and the first portion can extend beyond the second portion over a portion of the flexible substrate.

According to some embodiments of the present disclosure, the intermediate substrate is a first intermediate substrate and the module further comprises a second intermediate substrate having a fourth stiffness less than the second stiffness and greater than the third stiffness. The second intermediate substrate is disposed on the flexible substrate and the first intermediate substrate is disposed on the second intermediate substrate. The second intermediate substrate at least partially surrounds a perimeter of the rigid structure (e.g., wherein the second intermediate substrate has a void or wherein the second intermediate substrate comprises two physically separated portions between which the rigid structure is disposed).

According to some embodiments of the present disclosure, a variable-stiffness module comprises a rigid structure having a first stiffness, an intermediate substrate having a second stiffness less than the first stiffness, wherein the rigid structure is disposed on the intermediate substrate, a flexible substrate having a third stiffness less than or equal to the second stiffness. The intermediate substrate can be disposed on the flexible substrate and the rigid structure can be disposed at least partially between the intermediate substrate and the flexible substrate. A conductor can be disposed at least partially on the flexible substrate and connected to the rigid structure.

Certain embodiments of the present disclosure provide conductors connected to rigid structures on flexible substrates that have a greater mechanical tolerance and robustness to flexing.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1A is a plan view of a variable-stiffness module, FIG. 1B is a cross section of FIG. 1A taken along cross section line A of FIG. 1A.

FIG. 5 is a cross section of a device structure according to illustrative embodiments of the present disclosure;

FIGS. 6A and 6B are cross sections of a variable-stiffness substrate material according to illustrative embodiments of the present disclosure;

FIG. 7A is a plan view of a variable-stiffness module, FIG. 7B is a cross section of FIG. 7A taken along cross section line A of FIG. 7A.

FIGS. 12-16 are cross sections of variable-stiffness modules according to illustrative embodiments of the present disclosure;

Figure 1C:
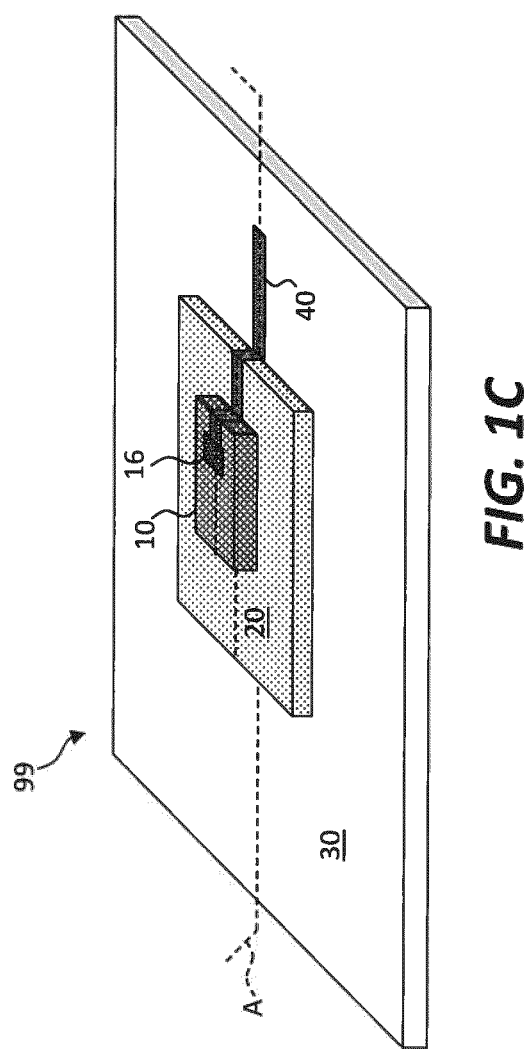
FIG. 1C is a perspective of FIG. 1A indicating cross section line A of FIG. 1A according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, or structurally similar elements. The figures are not drawn to scale since the variation in size of various elements in the Figures is too great to permit depiction to scale.

DETAILED DESCRIPTION OF CERTAIN EMBODIMENTS

The disclosed technology, inter alia, relates generally to rigid structures disposed on a flexible substrate (e.g., by micro-transfer printing) and connected to a conductor that extends from the rigid device to the flexible substrate. An intermediate substrate disposed between the rigid structure and flexible substrate that is less flexible than the flexible substrate and less rigid than the rigid structure can reduce conductor failures due to mechanical stress when flexed.

Figure 2A:
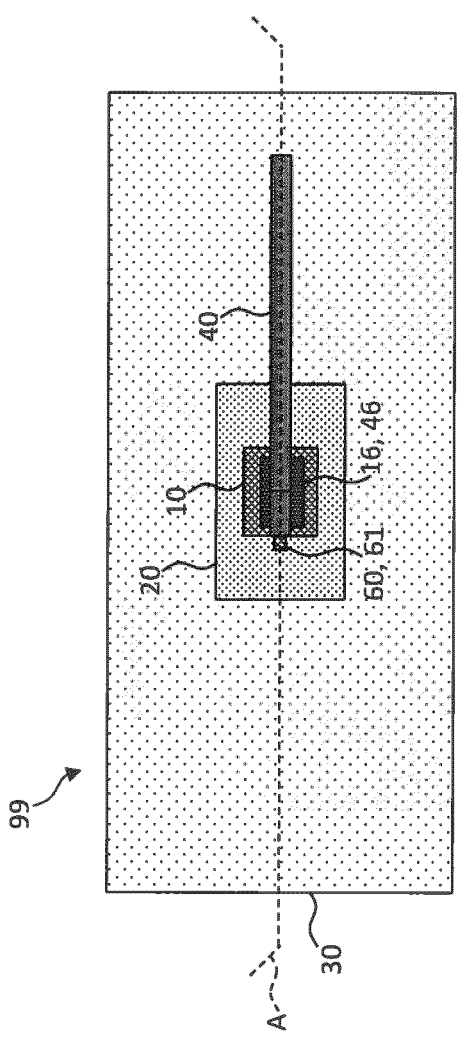
FIG. 2A is a plan view of a variable-stiffness module.
Figure 2B:
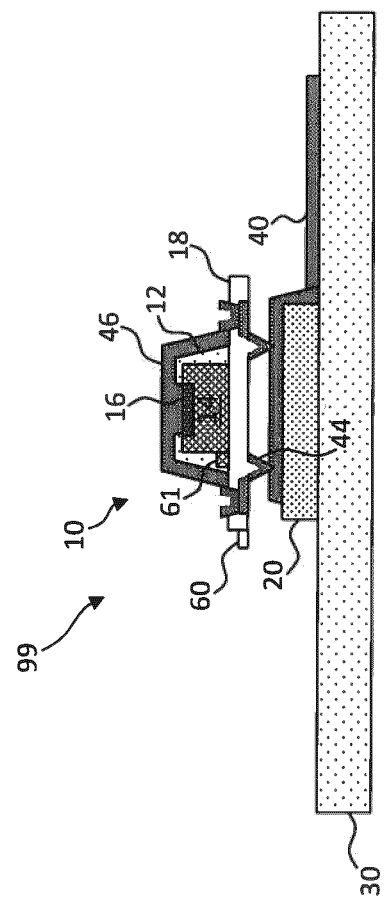
FIG. 2B is a cross section of FIG. 2A taken along cross section line A of FIG. 2A.
Figure 2C:
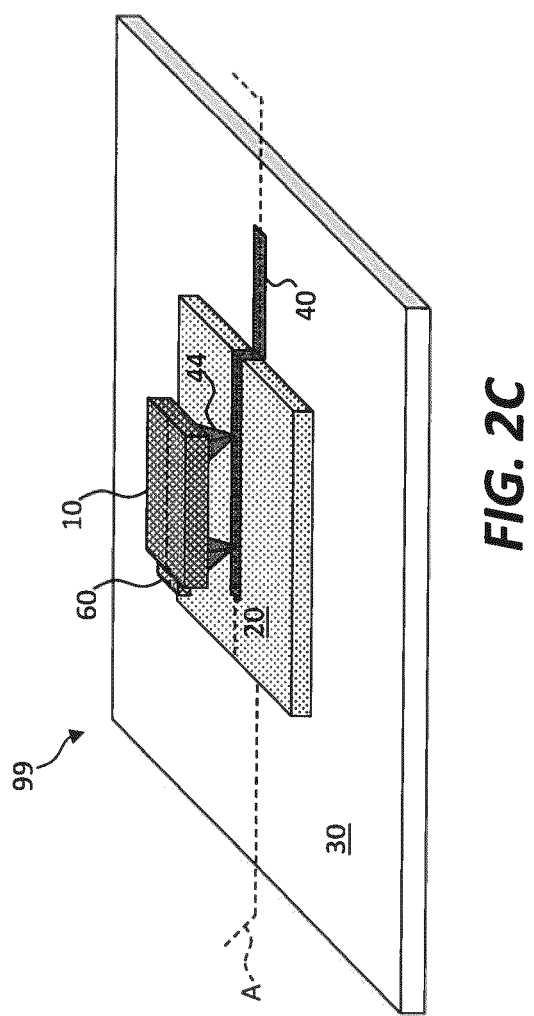
FIG. 2C is a perspective of FIG. 2A indicating cross section line A of FIG. 2A according to illustrative embodiments of the present disclosure.

Referring to the plan view of FIGS. 1A and 2A, the cross sections of FIGS. 1B and 2B, and the perspectives of FIGS. 1C and 2C, in some embodiments of the present disclosure a variable-stiffness module 99 comprises a rigid structure 10 having a first stiffness and an intermediate substrate 20 having a second stiffness less than the first stiffness. Rigid structure 10 is disposed at least partly on intermediate substrate 20. A flexible substrate 30 has a third stiffness less than the second stiffness and intermediate substrate 20 is disposed at least partly on flexible substrate 30. A conductor 40 is disposed on intermediate substrate 20 and on flexible substrate 30 and is connected to rigid structure 10. Conductor 40 extends from rigid structure 10 to intermediate substrate 20 to flexible substrate 30. Intermediate substrate 20 provides a more gradual transition in stiffness from rigid structure 10 to flexible substrate 30, thereby reducing stress in conductor 40 when variable-stiffness structure 99 is flexed, particularly at or near an edge of rigid structure 10. According to some embodiments of the present disclosure, mechanical stress is dispersed, reducing local stress at or near the edges of rigid structure 10, intermediate substrate 20, and flexible substrate 30. Reduced mechanical stress in conductor 40 helps to prevent or delay cracks or other deformations in conductor 40 and preserve conductor 40 functionality.

Conductor 40 can be, for example, an electrical conductor, for example a wire or metal trace, or an optical conductor, for example a light pipe or optical fiber. Conductor 40 can be constructed in place, for example using photolithographic methods and materials or can be constructed elsewhere and disposed (e.g., laminated) into position on intermediate substrate 20 and flexible substrate 30. In some embodiments, conductor 40 can be formed, coated, or laminated on rigid structure 10 or disposed between rigid structure 10 and intermediate substrate 20. Conductor 40 can be subsequently processed to pattern conductor 40 on intermediate substrate 20 or flexible substrate 30. In some embodiments, conductor 40 is disposed without any further patterning. Rigid structure 10 can be, for example, electrically or optically connected to conductor 40. In some embodiments, a variable-stiffness module 99 comprises two separate conductors 40 and the two conductors 40 are electrical conductors 40, are optical conductors 40, or one conductor 40 is an electrical conductor 40 and one conductor 40 is an optical conductor 40.

A rigid structure 10 can comprise a substrate as well as one or more other elements. Rigid structure 10 can comprise, for example, a patterned layer such as a dielectric layer (e.g., a silicon dioxide, silicon nitride, or glass layer), a metal layer, a semiconductor layer, or a plastic layer. Rigid structure 10 can comprise a processed or patterned device 14, such as a semiconductor device 14. Rigid structure 10 can comprise a rigid substrate 18 with one or multiple devices 14, such as electronic, semiconductor, optical, or electro-optic devices 14 disposed and connected on rigid substrate 18. Intermediate substrate 20 and flexible substrate 30 can be a multi-layer substrate, for example comprising one or more layers of polymer material such as PEN or PET or one or more layers of paper. Different substrate layers can form a stack or sandwich of layers. Each structure or layer can have a different thickness or comprise one or more different materials or combination of materials to provide a different structure stiffness. Flexible substrate 30 can be, for example, a banknote, a portion of a banknote, a document, or a portion of a document or other printed material. A flexible substrate 30 can have one or more elements disposed thereon or therein (e.g., that are electrically or optically connected to a rigid structure). An intermediate substrate 20 can have one or more elements disposed thereon or therein (e.g., that are electrically or optically connected to a rigid structure). For example, an intermediate substrate 20, a flexible substrate 30, or both an intermediate substrate 20 and a flexible substrate 30 can have one or more of a circuit, a power supply, and an antenna disposed thereon or therein.

Rigid structure 10 can be or comprise a device 14, for example a semiconductor integrated-circuit device 14 such as an electrical component, an optical component, or an electro-optical component and can comprise any one or more of contact pads 16, dielectric structures 12, device electrodes 46, and a rigid substrate 18. Device 14 can be disposed on rigid substrate 18 and can be electrically or optically connected to conductors (e.g., conductor 40 or a rigid-substrate conductor separate from conductor 40) that are partially disposed on rigid substrate 18. Rigid structure 10 can be or comprise one or more electronic, optical, or electro-optic devices 14, can be or comprise active or passive devices 14, and can be constructed using photolithographic processes known in the integrated-circuit industry. Device 14 can comprise one or more of an inorganic light emitter, such as a light-emitting diode or laser, a charge-storage device 14 such as a capacitor, a power converter, an inductor, or an integrated circuit such as a controller.

In some embodiments, for example as shown in FIGS. 1A-1C, semiconductor device 14 is rigid structure 10. Rigid structure 10 can be printed (e.g., micro-transfer printed) onto intermediate substrate 20 and can therefore comprise one or more broken or separated rigid-structure tethers 60 that, in some embodiments, are formed as a consequence of micro-transfer printing rigid structure 10 from a source wafer. Conductor 40 can be connected to rigid structure 10 and disposed on a top side of rigid structure 10 opposite intermediate substrate 20, as shown in FIGS. 1A-1C. In some such embodiments, the connection between conductor 40 and rigid structure 10 can be made using photolithographic methods and materials.

In some embodiments, for example as shown in FIGS. 2A-2C, rigid structure 10 can be or comprise a semiconductor device 14 disposed on a rigid substrate 18. Semiconductor device 14 can be a printed (e.g., micro-transfer printed) device 14 comprising a broken or separated device tether 61. Similarly, rigid structure 10 can itself be a printed (e.g., micro-transfer printed) structure comprising a broken or separated rigid-structure tether 60. Rigid structure 10 can be device 14; rigid-structure tether 60 and device tether 61 can therefore be the same tether.

Conductor 40 can be connected to rigid structure 10 and disposed between rigid structure 10 and intermediate substrate 20, as shown in FIGS. 2A-2C. At least one or more connection posts 44 are connected to conductor 40. In the embodiments illustrated in FIGS. 2A-2C, rigid structure 10 comprises connection posts 44 connected to semiconductor device 14 through contact pads 16 and device electrodes 46. The connection between conductor 40 and rigid structure 10 can be made by transfer printing rigid structure 10 onto intermediate substrate 20 so that connection posts 44 contact and are pressed into conductor 40, for example to make an electrical connection. Each connection post 44 can be connected to a separate conductor 40 (not shown) or different sets of connection posts 44 can be connected to different conductors 40. In some embodiments, a variable-stiffness module 99 comprises multiple conductors 40 that can each be connected to a different electrical or optical connection (e.g., contact pad 16) of device 14, for example each through a separate and independent connection post 44.

Connection posts 44 can be constructed during formation of a printable component (e.g., device 14), for example by etching depressions (e.g., pyramidal depressions) into a sacrificial layer (e.g., a crystalline layer), coating the depressions with metal and patterning the coated metal (e.g., by evaporation and patterning with photoresist), depositing a rigid substrate 18 over the coated depressions and sacrificial layer (e.g., by sputtering), forming any desired vias through rigid substrate 18 (e.g., by patterned etching), and removing the sacrificial layer, for example by selective etching [in order to release component (e.g., device 14) for printing]. Useful connection posts 44 and methods of making are described in U.S. patent application Ser. No. 14/822,864 and U.S. Pat. No. 8,889,485, the disclosure of each of which is hereby incorporated by reference herein in its entirety. Connection posts 44 can be disposed between intermediate substrate 20 and rigid substrate 18. Electrical connections between connection posts 44 and device 14 can be made by evaporating and patterning metal traces between the patterned coated metal and device 14, such as contact pads 16 and device electrodes 46 or forming light pipes, for example with dielectric organic (e.g., polymer) or inorganic (e.g., silicon dioxide or nitride) materials. Multiple connection posts 44 can be connected to a common conductor 40, for example to provide redundant connections, or each of multiple connection posts 44 can be connected to a different conductor 40, for example to transmit different signals.

Figure 3A:
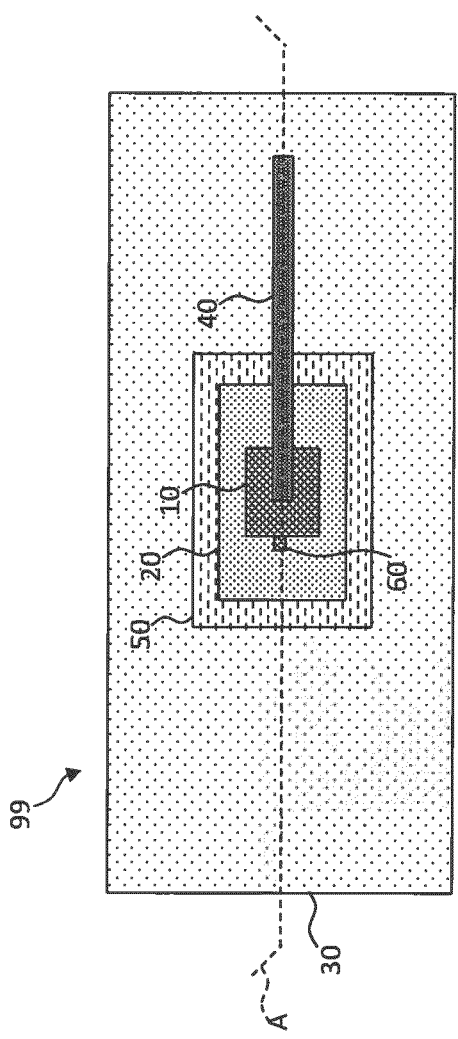
FIG. 3A is a plan view of a variable-stiffness module.
Figure 3B:
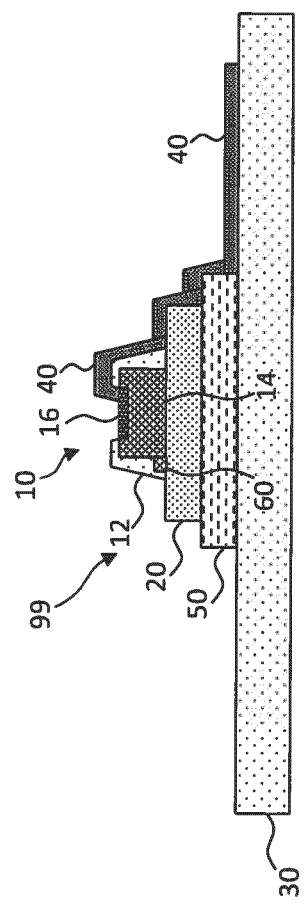
FIG. 3B is a cross section of FIG. 3A taken along cross section line A of FIG. 3A.
Figure 3C:
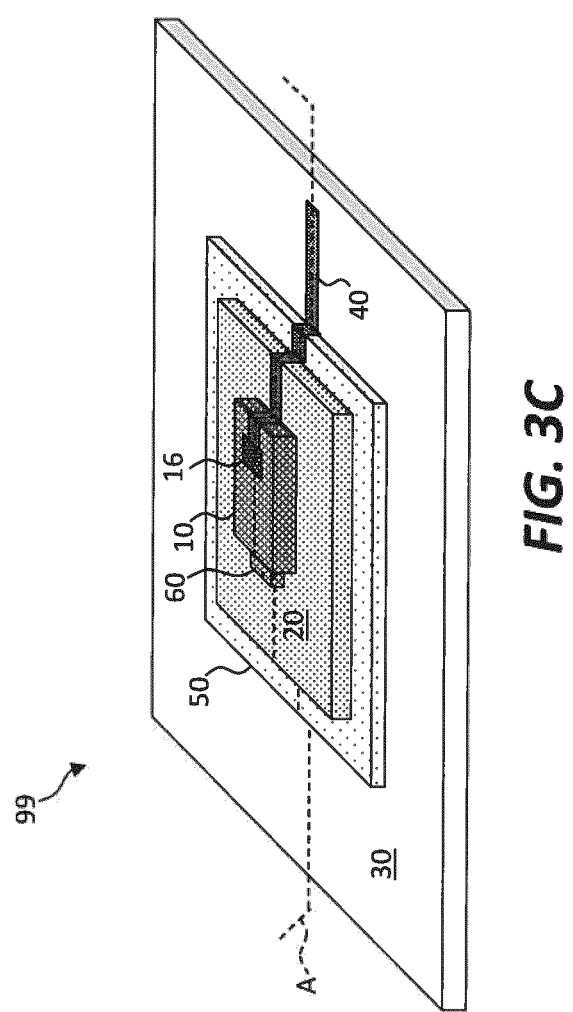
FIG. 3C is a perspective of FIG. 3A indicating cross section line A of FIG. 3A according to illustrative embodiments of the present disclosure.

Referring to FIGS. 3A-3C, in some embodiments, intermediate substrate 20 is a first intermediate substrate 20 and variable-stiffness module 99 further comprises a second intermediate substrate 50 having a stiffness less than a stiffness of intermediate substrate 20 and greater than a stiffness of flexible substrate 30. Second intermediate substrate 50 is disposed at least partly on flexible substrate 30 and first intermediate substrate 20 is disposed on second intermediate substrate 50. Conductor 40 extends from first intermediate substrate 20 to second intermediate substrate 50 to flexible substrate 30. Such additional intermediate substrates (e.g., first and second intermediate substrates 20, 50) provide a more gradual and dispersed change in stiffness between rigid structure 10 and flexible substrate 30, reducing stress in conductor 40 at each substrate transition.

Figure 4A:
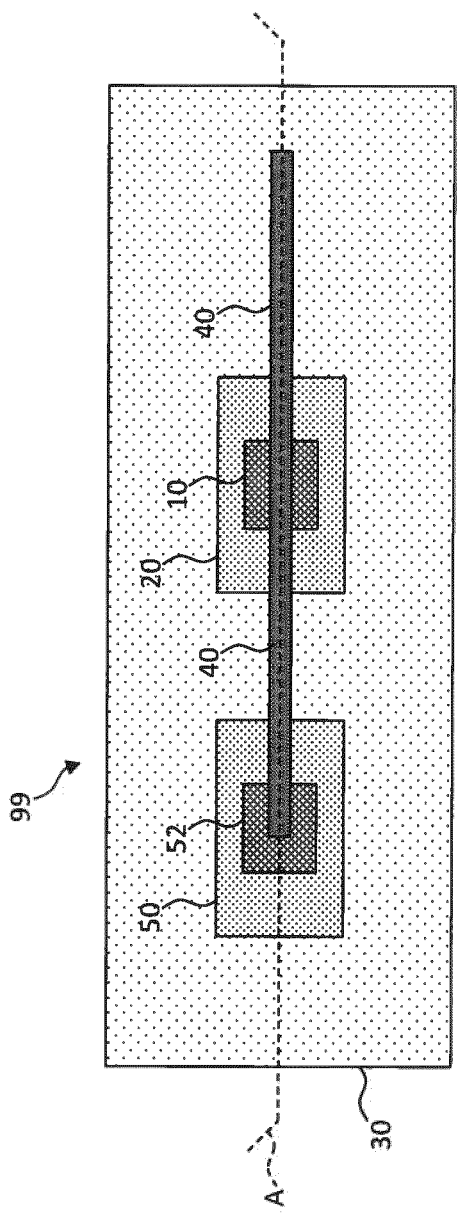
FIG. 4A is a plan view of a variable-stiffness module.
Figure 4B:
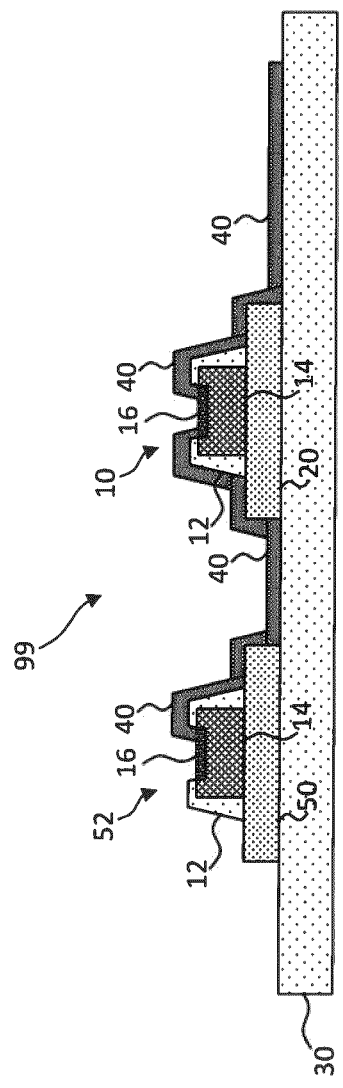
FIG. 4B is a cross section of FIG. 4A taken along cross section line A of FIG. 4A.
Figure 4C:
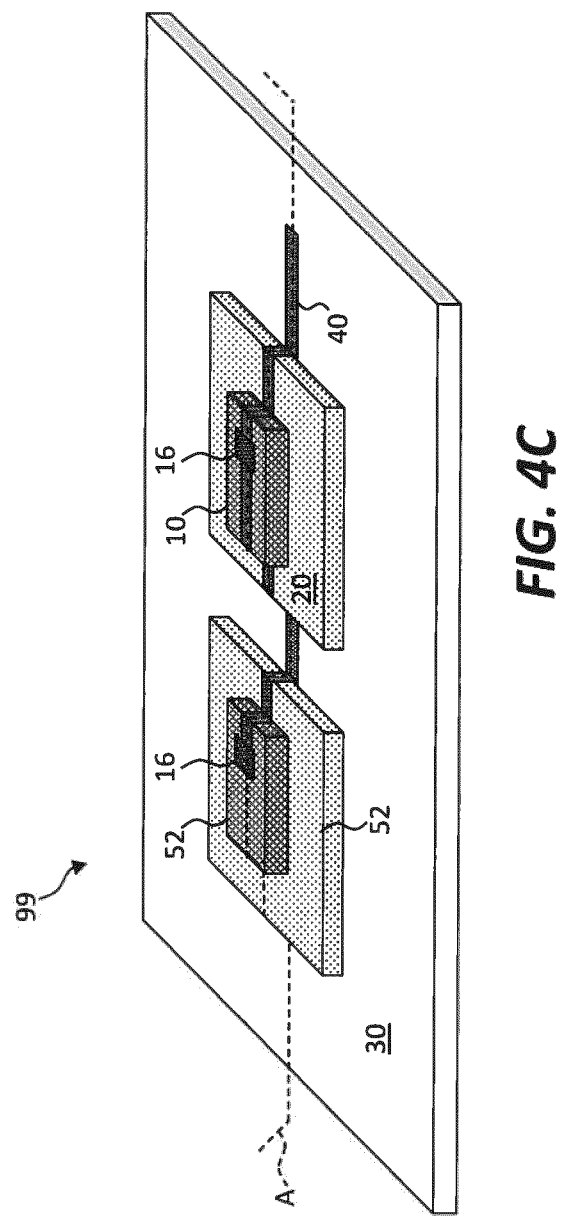
FIG. 4C is a perspective of FIG. 4A indicating cross section line A of FIG. 4A according to illustrative embodiments of the present disclosure.

Referring to FIGS. 4A-4C, in some embodiments of variable-stiffness module 99, rigid structure 10 is a first rigid structure 10 and variable-stiffness module 99 further comprises a second rigid structure 52 having a stiffness greater than at least one of (e.g., both of) a stiffness of intermediate substrate 20 and a stiffness of flexible substrate 30. Second rigid structure 52 can be disposed on flexible substrate 30 and conductor 40 can extend from first rigid structure 10 to second rigid structure 52. In some embodiments, first rigid structure 10 and second rigid structure 52 are disposed on a common intermediate substrate 20. In some embodiments, second rigid structure 52 is disposed on a second intermediate substrate 50 different from intermediate substrate 20 (e.g., first intermediate substrate 20). In some embodiments, second intermediate substrate 50 and first intermediate substrate 20 are both disposed on flexible substrate 30, as shown in FIGS. 4A and 4B. According to some embodiments of the present disclosure, first intermediate substrate 20 and second intermediate substrate 50 can overlap on flexible substrate 30, or not.

Referring to FIG. 5, a rigid structure 10 can comprise a device 14 disposed on or adhered to a rigid substrate 18, for example by micro-transfer printing, resulting in a broken rigid-structure tether 60. Device 14 can comprise a dielectric structure 12 that insulates device 14 from conductor 40 connected to contact pad 16. According to some embodiments, at least a portion of a power supply 32 (e.g., a power supply 32) is disposed on or in flexible substrate 30. If conductor 40 is an electrical conductor 40, power supply 32 can be electrically connected to electrical conductor 40. As shown in FIG. 5, flexible substrate 30 can comprise a first flexible layer 34 comprising a first material and a second flexible layer 36 comprising a second material different from the first material, the second flexible layer 36 disposed on the first flexible layer 34. Power supply 32 can be or comprise a tribo-electric power supply, a piezo-electric power supply, or a photo-voltaic power supply. According to some embodiments, an external power supply connects to electrical conductor 40, optionally via direct conductive connection or via inductive connection. According to some embodiments, rigid structure 10 is encapsulated after disposing rigid structure 10 on intermediate substrate 20. Such encapsulation can improve rigid structure 10 robustness in the presence of environmental stresses. In some embodiments, such encapsulation can help to maintain the physical alignment of conductor 40 with rigid structure 10 and to reduce stress between conductor 40 and rigid structure 10.

According to some embodiments of the present disclosure, one or more of intermediate substrate 20 and flexible substrate 30 has a variable stiffness. A variable stiffness further disperses or distributes mechanical stress due to flexing, thereby reducing local stress and preventing or ameliorating conductor 40 flexing or cracking. Referring to FIG. 6A one or more of intermediate substrate 20 and flexible substrate 30 has a variable thickness, for example a thickness T1 at one end of intermediate substrate 20 or flexible substrate 30 that is less than a thickness T2 at an opposite end of intermediate substrate 20 or flexible substrate 30. A thinner substrate typically will be more flexible than a thicker substrate. Referring to FIG. 6B, intermediate substrate 20 or flexible substrate 30 can have one or more of a variable material quantity, a variable material composition, or a variable material density along its length or width. The variation is illustrated in FIG. 6B by a variation in the darkness of a substrate (e.g., intermediate substrate 20 or flexible substrate 30). According to some embodiments of the present disclosure, any one or a combination of a stiffness of rigid structure 10, a stiffness of intermediate substrate 20, and a stiffness of a flexible substrate 30 can be a variable stiffness.

Where a first substrate (e.g., intermediate substrate 20, second intermediate substrate 50, or flexible substrate 30) has a stiffness less than a stiffness of a second substrate (e.g., intermediate substrate 20 or second intermediate substrate 50) or a structure (e.g., rigid structure 10) and the first substrate has a variable stiffness, the maximum stiffness of the first substrate in its range of stiffness variability is less than or equal to the stiffness of the second substrate or the structure, respectively. For example, where intermediate substrate 20 has a stiffness greater than flexible substrate 30 and intermediate substrate 20 has a variable stiffness, the minimum stiffness of intermediate substrate 20 in its range of stiffness variability is greater than or equal to the stiffness of flexible substrate 30. As another example, where flexible substrate 30 has a stiffness less than intermediate substrate 20 and flexible substrate 30 has a variable stiffness, the maximum stiffness of flexible substrate 30 in its range of stiffness variability is less or equal to than the stiffness of intermediate substrate 20.

According to some embodiments of the present disclosure, (i) rigid structure 10 comprises semiconductor, glass, plastic, polymer or metal or a semiconductor, glass, plastic, polymer or metal substrate (e.g., rigid substrate 18), (ii) intermediate substrate 20 comprises polymer or paper, (iii), flexible substrate 30 comprises polymer or paper, or (iv) any combination of (i), (ii), and (iii). Flexible substrate 30 can be, for example, a banknote, a portion of a banknote, a document, or a portion of a document. In some embodiments, intermediate substrate 20 can be formed, coated, or laminated over flexible substrate 30 and intermediate substrate 20 can be subsequently processed. In some embodiments, intermediate substrate 20 is disposed without any further patterning.

Figure 7C:
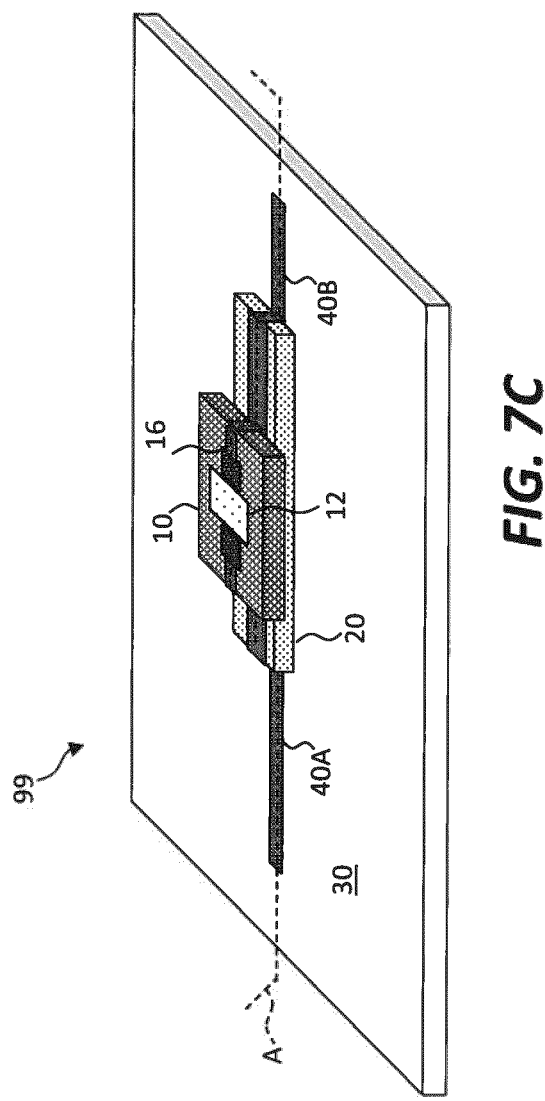
FIG. 7C is a perspective of FIG. 7A indicating cross section line A of FIG. 7A according to illustrative embodiments of the present disclosure.

In some embodiments of the present disclosure, rigid structure 10 is disposed entirely over intermediate substrate 20. In some embodiments, rigid structure 10 can cover intermediate substrate 20 (so that they have the same extent over flexible substrate 30). In some embodiments, as shown in FIGS. 1A-4C, rigid structure 10 is disposed entirely over intermediate substrate 20 but covers only a portion of intermediate substrate 20 (so that the extent of intermediate substrate 20 over flexible substrate 30 is greater than the extent of rigid structure 10 over flexible substrate 30). Referring to FIG. 7A-7C, rigid structure 10 is disposed only partly on intermediate substrate 20, so that rigid structure 10 overhangs intermediate substrate 20 on one or more sides of intermediate substrate 20. As is shown in FIGS. 7A-7C, intermediate substrate 20 extends beyond rigid structure 10 in a direction parallel to the length direction in which conductor 40 extends. Likewise, flexible substrate 30 extends beyond intermediate substrate 20 in a direction parallel to a surface of flexible substrate 30. Thus, in some embodiments, rigid structure 10 has a first area, intermediate substrate 20 has a second area greater than the first area, and flexible substrate 30 has a third area greater than the second area. An area can be a planar extent in a plane substantially parallel to a surface of a substrate, for example a surface of flexible substrate 30.

Referring further to FIGS. 7A-7C, in some embodiments, a variable-stiffness module 99 comprises two separate conductors 40 (e.g., first conductor 40A and second conductor 40B). As with conductor 40, both first conductor 40A and second conductor 40B can be connected to rigid structure 10 and extend from rigid structure 10 to intermediate substrate 20 to flexible substrate 30. Second conductor 40B can be disposed at least partially on a side of rigid structure 10 opposite first conductor 40A (in a combination of FIGS.

Figure 8:
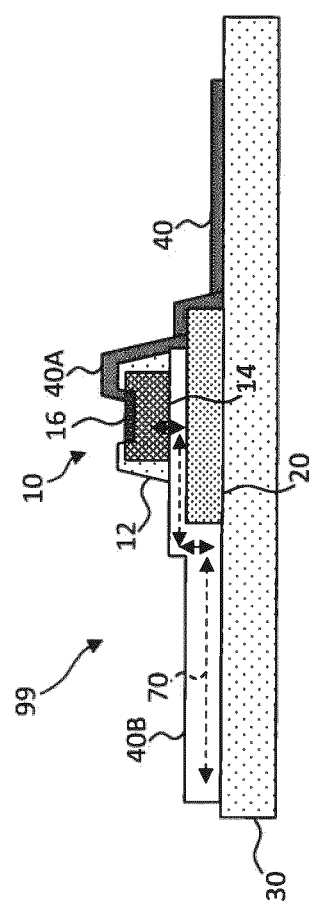
FIG. 8 is a cross section according to illustrative embodiments of the present disclosure.

1A-1C and 2A-2C and in FIG. 8, discussed further below). In some embodiments, second conductor 40B can be disposed at least partially on a same side of rigid structure 10 as first conductor 40A (for example, as shown in FIG. 7A-7C). In some embodiments, second conductor 40B can be disposed at least partially between rigid structure 10 and intermediate substrate 20 (for example, as shown in FIGS. 2A-2C). In some embodiments, first and second conductors 40A, 40B can be disposed at least partially on a same side of rigid structure 10 opposite intermediate substrate 20, for example as shown in FIG. 7A-7C. In some embodiments, first conductor 40A can be an electrical conductor and second conductor 40B can be an optical conductor that conducts light 70, for example as shown in FIG. 8.

Figure 9A:
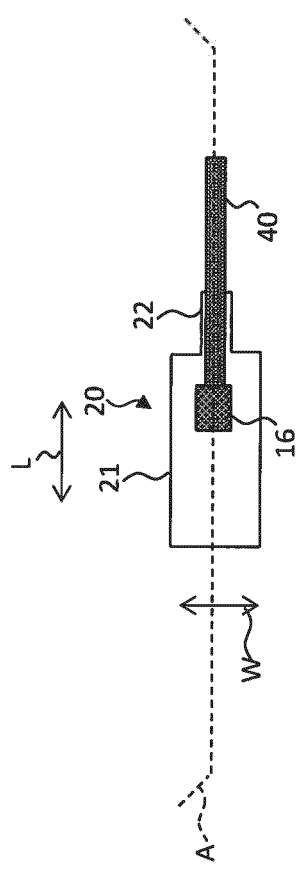
FIG. 9A is a partial plan view of an intermediate substrate indicating a cross section line A and FIG. 9B is a perspective of FIG. 9A indicating cross section line A of FIG. 9A according to illustrative embodiments of the present disclosure.
Figure 9B:
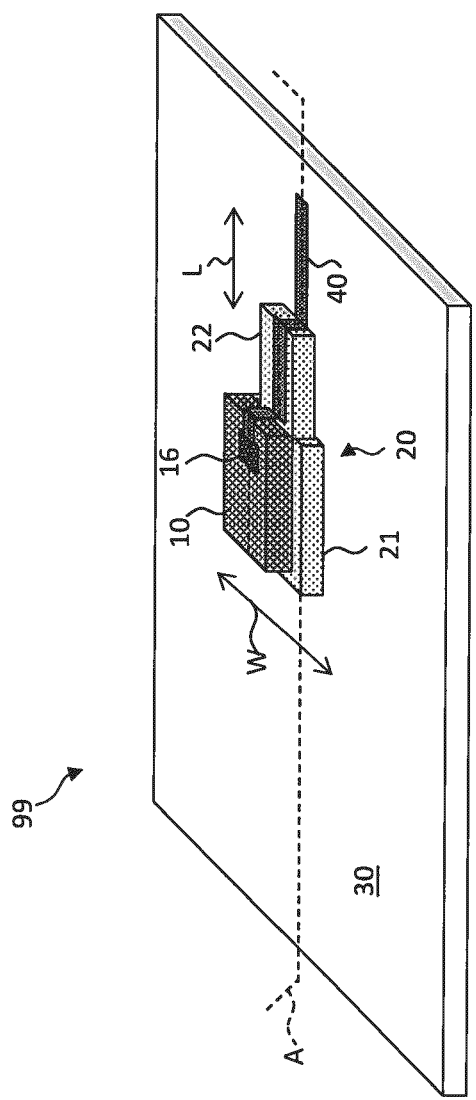

Referring to FIGS. 9A-9C, in some embodiments, intermediate substrate 20 is not a rectangle and can have or comprise a protrusion or extension 22 that extends from a body 21 of intermediate substrate 20 beyond rigid structure 10 in a length direction L parallel to a surface of intermediate substrate 20 and also in a length direction L in which conductor 40 extends (e.g., in a direction of the length of conductor 40). Intermediate substrate protrusion or extension 22 can have a smaller area than intermediate substrate body 21 and have a width that is less than a width of intermediate substrate body 21 in a width direction W orthogonal to length direction L in which intermediate substrate protrusion or extension 22 extends from intermediate substrate body 21. Such a variable-stiffness module 99 can have increased flexibility due to the reduced area of intermediate substrate 20, particularly in a direction orthogonal to the direction in which protrusion 22 extends from intermediate substrate body 21 and still providing improved resistance to stress for conductor 40.

Figure 10:
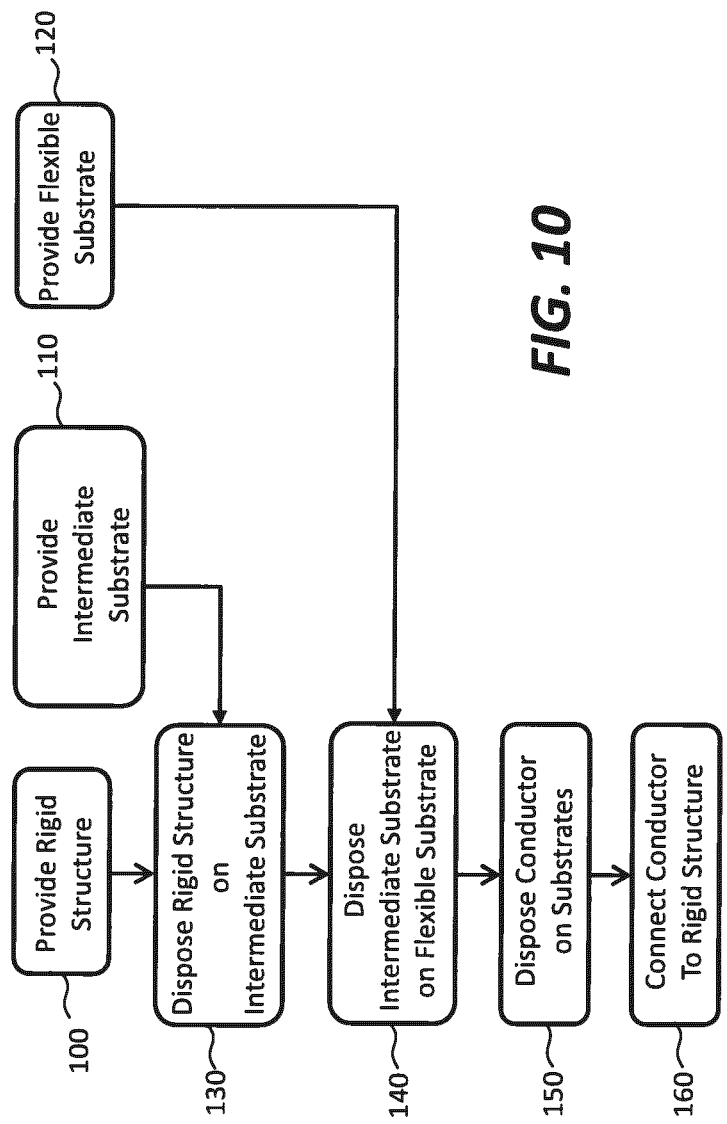
FIG. 10 is a flow diagram illustrating methods in accordance with embodiments of the present disclosure.
Figure 11:
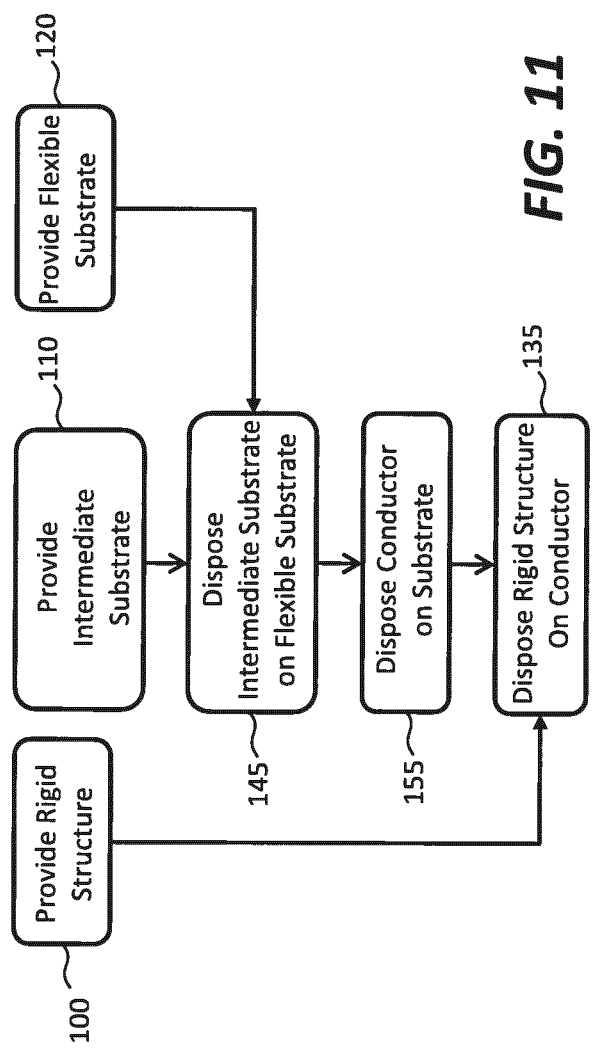
FIG. 11 is a flow diagram illustrating methods in accordance with embodiments of the present disclosure.

Referring to the flow diagrams of FIGS. 10 and 11, a method of making a variable-stiffness module 99 according to various embodiments of the present disclosure comprises providing a rigid structure 10 having a first stiffness in step 100, providing an intermediate substrate 20 having a second stiffness less than the first stiffness in step 110, and providing a flexible substrate 30 having a third stiffness less than the second stiffness in step 120. Rigid structure 10, intermediate substrate 20, and flexible substrate 30 can be provided at any time and in any order before being combined into a variable-stiffness module 99. Rigid structure 10 is disposed on intermediate substrate 20 in step 130 and intermediate substrate 20 is disposed on flexible substrate 30 in step 140. Although, as shown in FIG. 10, step 130 precedes step 140, in some embodiments, intermediate substrate 20 is disposed on flexible substrate 30 (step 140) before rigid structure 10 is disposed on intermediate substrate 20 (step 130). In step 150, a conductor 40 is disposed at least partially on intermediate substrate 20 and at least partially on flexible substrate 30. In step 160, conductor 40 is connected (e.g., electrically or optically) to rigid structure 10 so that conductor 40 extends from rigid structure 10 to intermediate substrate 20 to flexible substrate 30. In some embodiments, connecting conductor 40 (step 160) is done after conductor 40 is disposed on intermediate substrate 20 and flexible substrate 30 in a separate step (e.g., a photolithographic or mechanical step). In some embodiments, the step of disposing conductor 40 on intermediate and flexible substrates 20, 30 (step 150) can be the same step as connecting rigid structure 10 to conductor 40 (step 160). That is, the disposing and the connecting can occur simultaneously. For example, a photolithographic process can pattern a conductor 40 at least partially on rigid structure 10, intermediate substrate 20, and flexible substrate 30 in one common step so that steps 150 and 160 are combined.

Referring to FIG. 11, in some embodiments the step of disposing rigid structure 10 on intermediate substrate 20 can be the same step as connecting conductor 40 to rigid structure 10. As shown in FIG. 11, rigid structure 10, intermediate substrate 20, and flexible substrate 30 are all provided in steps 100, 110, and 120, respectively, as in FIG. 10. Intermediate substrate 20 is disposed on flexible substrate 30 in step 145 and conductor 40 is disposed on intermediate substrate 20 and flexible substrate 30 in step 155. Rigid structure 10 is then disposed on conductor 40, for example by mechanical means, to connect rigid structure 10 to conductor 40 in one common step 135.

Rigid structure 10 can be disposed on intermediate substrate 20 by micro-transfer printing. Referring back to FIGS. 2A-2C, the disposition of rigid structure 10 on intermediate substrate 20 can also connect rigid structure 10 to conductor 40 (step 135) by providing rigid structure 10 with connection posts 44. According to some embodiments, conductor 40 is connected to rigid structure 10 (and optionally to intermediate substrate 20 and flexible substrate 30) by adhering a pre-formed conductor 40 to one or more of rigid structure 10, intermediate substrate 20, and flexible substrate 30, for example by lamination of a structure including conductor 40 formed on a donor substrate, adhering conductor 40 to any one or more of rigid structure 10, intermediate substrate 20, and flexible substrate 30, and removing the donor substrate.

In some embodiments of the present disclosure, rigid structure 10 is disposed on or over intermediate substrate 20 (first intermediate substrate 20) which is itself disposed on or over flexible substrate 30, for example as shown in FIGS. 1A and 1B. In some embodiments, for example as illustrated in FIGS. 12-21, rigid structure 10 is disposed within a substrate or between two substrates. By disposing rigid structure 10 within a substrate (e.g., layer) or between substrates (e.g., layers) (e.g., that are physically separated over an extent of flexible substrate 30) of variable-stiffness module 99, rigid structure 10 is protected by the substrate(s) from mechanical disruption such as pressing or scraping or environmental contamination. In some such embodiments, first and second intermediate substrates 20, 50 can be substantially transparent (e.g., at least 50% transparent) to any light (e.g., visible light) emitted by device 14 and emitted light can pass through one or both of first and second intermediate substrates 20, 50.

Figure 12:
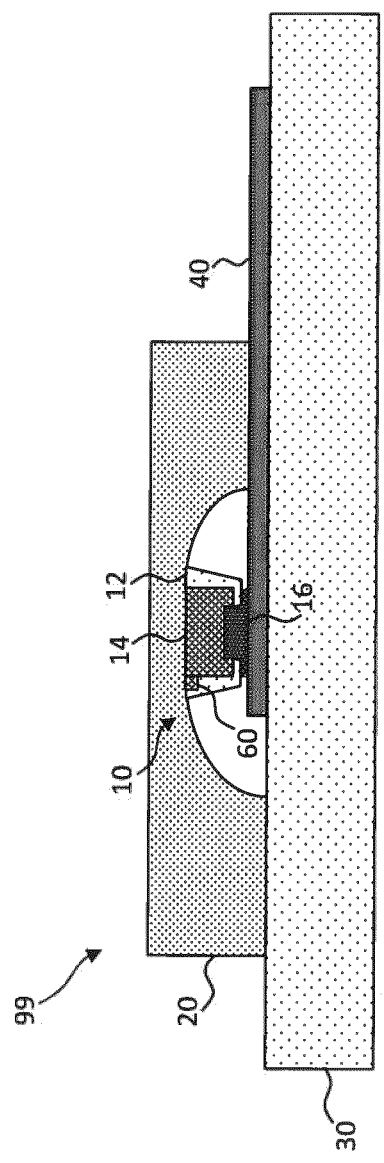

Referring to FIG. 12, rigid structure 10 is disposed on or adhered to a bottom side of first intermediate substrate 20 and first intermediate substrate 20 is disposed on (e.g., adhered (e.g., laminated) to) flexible substrate 30. First intermediate substrate 20 can comprise a compressible material so that rigid structure 10 presses into, compresses, or both presses into and compresses a portion of first intermediate substrate 20 (as shown), presses into, compresses, or both presses into and compresses a corresponding portion of flexible substrate 30 (not shown), or both. If rigid structure 10 presses into, compresses, or both presses into and compresses flexible substrate 30, because rigid structure 10 is not necessarily adhered to flexible substrate 30 mechanical stress on flexible substrate 30 does not necessarily stress rigid structure 10. Instead, mechanical stress on flexible substrate 30 can be mitigated by first intermediate substrate 20. Conductor 40 can be disposed, and optionally patterned, on flexible substrate 30 and rigid structure 10 can be disposed on and adhered to the bottom side of first intermediate substrate 20 before the bottom side of first intermediate substrate 20 is adhered (e.g., laminated) to flexible substrate 30. Contact pad 16 can be pressed against and in electrical contact with conductor 40. In some embodiments, multiple contact pads 16 and multiple distinct conductors 40 can be provided and pressed into electrical contact to form multiple distinct electrical connections (not shown in FIG. 12, see FIGS. 7A-7C for example).

Figure 13:
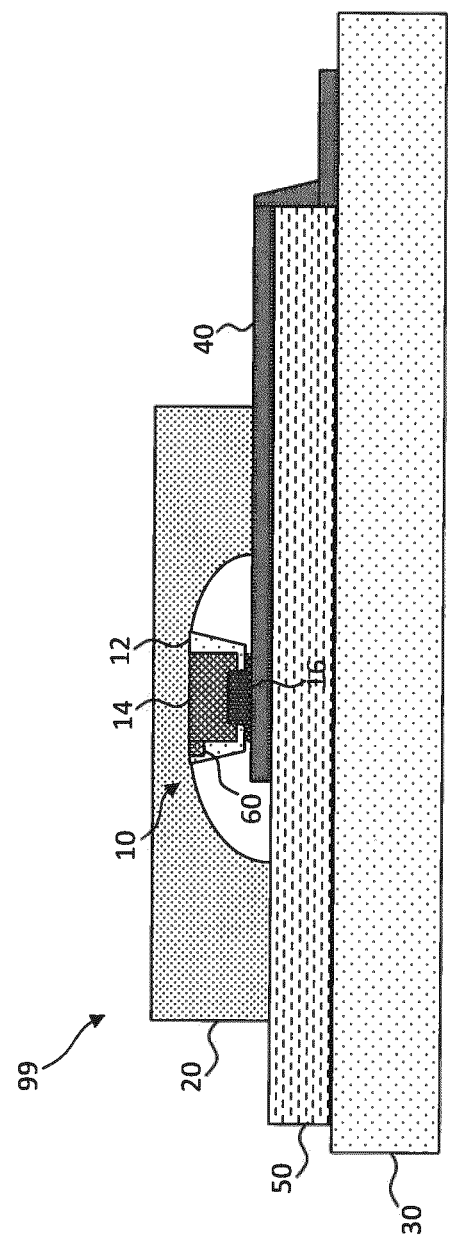

As shown in FIG. 13, rigid structure 10 is disposed on or adhered to a bottom side of first intermediate substrate 20, first intermediate substrate 20 is disposed on (e.g., adhered or laminated to) second intermediate substrate 50, and second intermediate substrate 50 is disposed on (e.g., adhered (e.g., laminated) to) flexible substrate 30. First intermediate substrate 20 and second intermediate substrate 50 can comprise compressible materials so that rigid structure 10 presses into, compresses, or both presses into and compresses a portion of first intermediate substrate 20, presses into, compresses, or both presses into and compresses a corresponding portion of second intermediate substrate 50, or both. If rigid structure 10 presses into, compresses, or both presses into and compresses second intermediate substrate 50, because rigid structure 10 is not necessarily adhered to second intermediate substrate 50 mechanical stress on flexible substrate 30 and second intermediate substrate 50 does not necessarily stress rigid structure 10. Instead, mechanical stress on flexible substrate 30 can be mitigated by second intermediate substrates 50 and then by first intermediate substrate 20. Conductor 40 can be disposed, and optionally patterned, on flexible substrate 30 and second intermediate substrate 50 and rigid structure 10 can be disposed on (e.g., adhered to) the bottom side of first intermediate substrate 20 before the bottom side of first intermediate substrate 20 is adhered or laminated to second intermediate substrate 50. Contact pad 16 can be pressed against and in electrical contact with conductor 40. In some embodiments, multiple contact pads 16 and multiple distinct conductors 40 can be provided and pressed into electrical contact to form multiple distinct electrical connections (not shown in FIG. 13, see FIGS. 7A-7C for example).

As shown in FIG. 12, rigid structure 10 can be disposed within first intermediate substrate 20 or between a compressed portion of first intermediate substrate 20 and a possibly compressed portion of flexible substrate 30. Similarly, as shown in FIG. 13, rigid structure 10 can be disposed within first intermediate substrate 20 or between compressed portion of first intermediate substrate 20 and a possibly compressed portion of flexible substrate 30. In some embodiments, first and second intermediate substrate 20, 50 have some structural integrity and do not flow to accommodate the presence of rigid structure 10 such that air pockets or bubbles can be formed around rigid structure 10 when first intermediate substrate 20 is adhered (e.g., laminated) to flexible substrate 30 (e.g., as in FIG. 12) or adhered (e.g., laminated) to second intermediate substrate 50 (e.g., as in FIG. 13).

According to some embodiments of the present disclosure, and with reference to FIG. 14, rigid structure 10 can be disposed on flexible substrate 30 or on conductor 40 on flexible substrate 30 and a layer can be disposed over, for example coated over, flexible substrate 30 and rigid structure 10. The coated layer can be cured to form first intermediate substrate 20 with no or reduced air pockets or bubbles in variable-stiffness module 99. When cured, first intermediate substrate 20 can have a stiffness greater than that of flexible substrate 30 and less than that of rigid structure 10. Similarly, as shown in FIG. 15, a layer can be coated over flexible substrate 30, conductor 40, and rigid structure 10 and cured to form second intermediate substrate 50 and then another layer can be subsequently coated over second intermediate substrate 50 and cured to form first intermediate substrate 20, each with a desired stiffness, thereby reducing or eliminating air pockets or bubbles around rigid structure 10.

Figure 16:
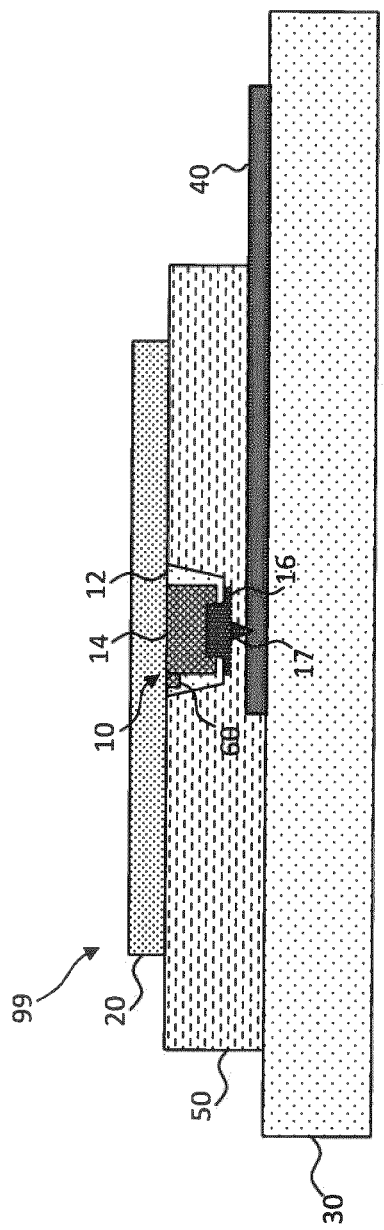
Figure 17:
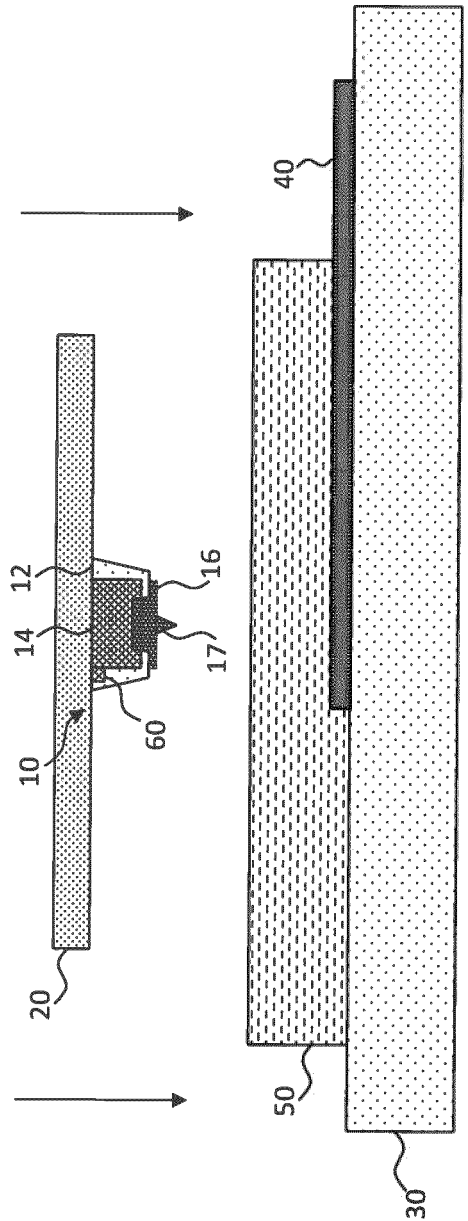
FIG. 17 is a cross section illustrating a method of constructing the variable-stiffness module of FIG. 16.

According to some embodiments of the present disclosure, and as illustrated in FIG. 16, a variable-stiffness module 99 can be constructed by disposing rigid structure 10 on first intermediate substrate 20. Rigid structure 10 can comprise an electrically conductive spike 17, for example having a sharp point with a distal end smaller than a proximal end of spike 17, that extends away from the body of rigid structure 10 and device 14 and is in electrical contact with contact pad 16. Such a spike 17 can be made of metal using photolithographic processes, for example as described in U.S. Patent Publication No. 2017-0047303 A1, which is hereby incorporated by reference herein in its entirety, and can be used in, for example, any of the embodiments illustrated in FIGS. 12-15. In some embodiments, for example as shown in FIG. 17, rigid structure 10 is brought into contact with conductor 40, for example by pressing first intermediate substrate 20 against an uncured layer that is subsequently cured to form variable-stiffness module 99 as illustrated in FIG. 16. In some such embodiments, second intermediate substrate 50 can be disposed in a viscous but liquid state in which rigid structure 10 is pressed through the viscous liquid so that spike 17 is embedded in or pierces conductor 40 to form an electrical contact. The viscous liquid can then be cured to form second intermediate substrate 50. Rigid structure 10 need not be adhered to, or strongly adhered to, second intermediate substrate 50, since it is adhered to first intermediate substrate 20, first intermediate substrate 20 is adhered to second intermediate substrate 50, and second intermediate substrate 50 is adhered to flexible substrate 30.

Figure 18:
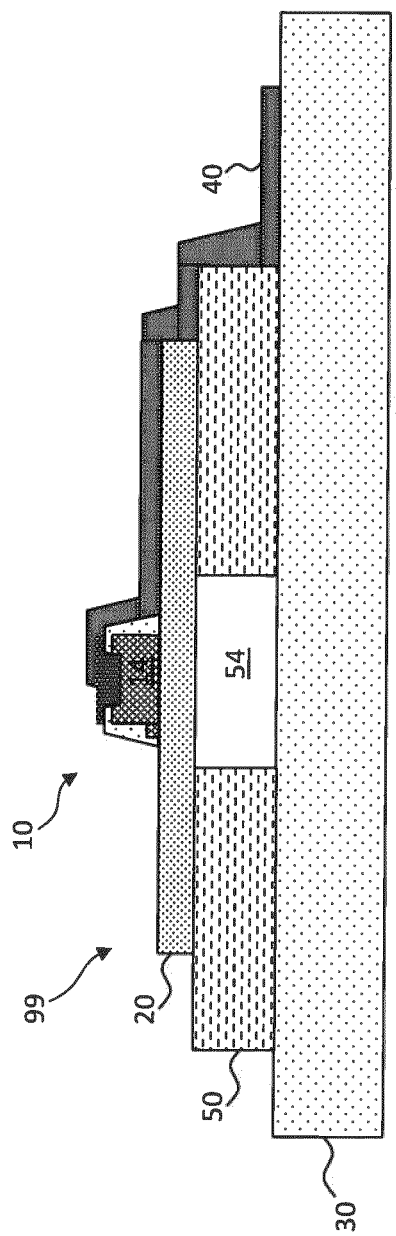
FIGS. 18-21 are cross sections of variable-stiffness modules according to illustrative embodiments of the present disclosure.

In some embodiments, and as illustrated in FIG. 18, rigid structure 10 is disposed over first intermediate substrate 20 and void 54 is disposed directly below rigid structure 10 on an opposite side of first intermediate substrate 20 in second intermediate substrate 50. Conductor 40 is disposed on rigid structure 10, first intermediate substrate 20, second intermediate substrate 50, and flexible substrate 30. Embodiments according to FIG. 18 can be constructed by laminating first intermediate substrate 20 with rigid structure 10 onto second intermediate substrate 50 patterned with void 54 and flexible substrate 30. Conductor 40 is then patterned over the layers. Such an arrangement can allow pressure on rigid structure 10 to press rigid structure 10 into void 54 mitigating any damage to rigid structure 10 or first intermediate structure 20.

Figure 19:
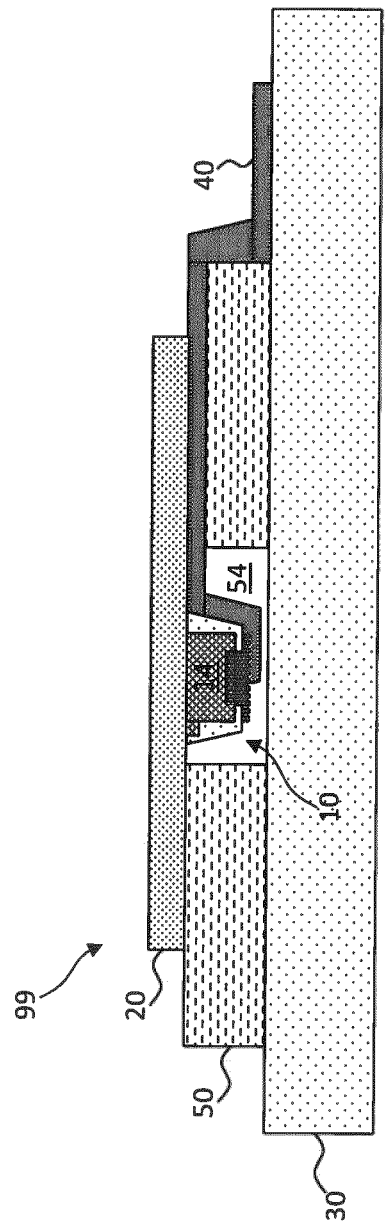

In some embodiments, and as illustrated in FIG. 19, rigid structure 10 is disposed below first intermediate substrate 20 in void 54 in second intermediate substrate 50. Embodiments according to FIG. 19 can be constructed by disposing rigid structure 10 on first intermediate substrate 20 and forming a portion of electrode 40 on rigid structure 10 and first intermediate substrate 20. Second intermediate substrate 50 is patterned on flexible substrate 30 with void 54 and a portion of electrode 40 formed on second intermediate substrate 50 and flexible substrate 30. Rigid structure 10 and first intermediate substrate 20 are then inverted and disposed with rigid structure 10 in void 54 onto second intermediate substrate 50 with conductor 40 on each of first intermediate substrate 20 and second intermediate substrate 50 in electrical and physical contact. Such an arrangement can protect rigid structure 10 with first intermediate structure 20.

Figure 20:
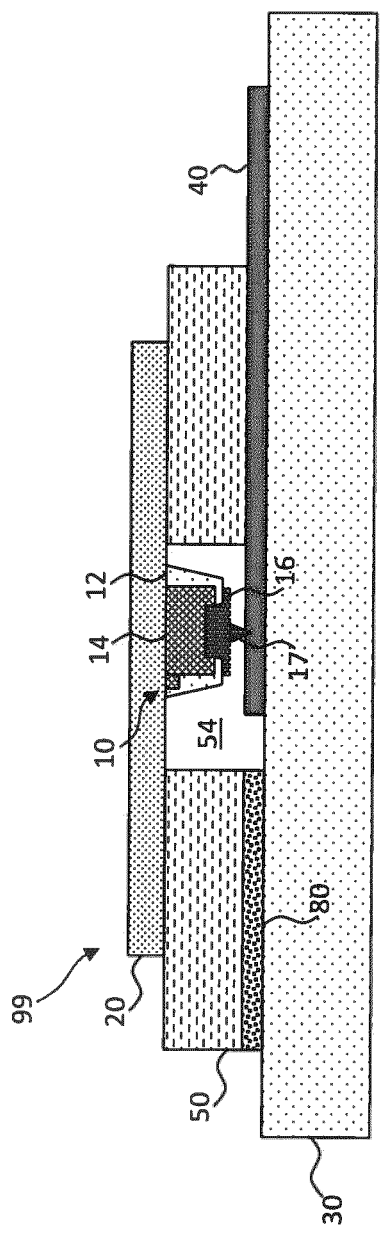

In some embodiments, and as illustrated in FIG. 20, rigid structure 10 with (or without) spike 17 extends from first intermediate substrate 20 through void 54 so that spike 17 is electrically connected to conductor 40; conductor 40 is disposed on flexible substrate 30. Embodiments according to FIG. 20 can be constructed by laminating first intermediate substrate 20 with rigid structure 10 onto second intermediate substrate 50 and flexible substrate 30 with conductor 40 so that spike 17 is in electrical contact with conductor 40.

Figure 21:
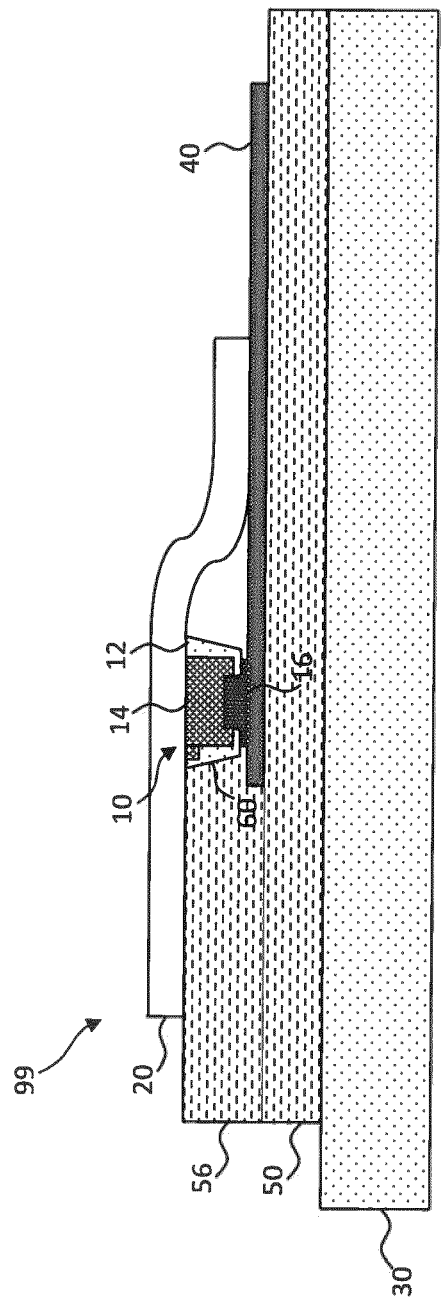

As shown in FIG. 21, a third intermediate substrate 56 can be disposed on second intermediate substrate 50 and can have a stiffness between that of first and second intermediate substrates 20, 50. Third intermediate substrate 56 can extend completely between first and second intermediate substrates 20 and 50 or, as shown, can be patterned and a portion of first intermediate substrate 20 can be in contact with and adhered to second intermediate substrate 50. Layers, substrates, or structures of variable-stiffness module 99 can be adhered together with adhesive 80, for example as shown in FIG. 20. Such arrangements can provide additional protection and flexibility to variable-stiffness module 99.

Devices 14 may be prepared on a native source substrate and printed to a target intermediate substrate 20 (e.g., plastic, polymer, metal, glass, ceramic, sapphire, transparent materials, opaque materials, rigid materials, or flexible materials), thereby obviating the manufacture of devices 14 on intermediate substrate 20. Devices 14 (e.g., micro-devices or chiplets) can be small integrated circuits, can be unpackaged dies released from a source substrate, and can be micro-transfer printed. Devices 14 can have a width from 1 µm to 8 µm, a length from 5 µm to 10 µm, or a height from 0.5 µm to 3 µm. Transfer-printable devices 14 can have at least one of a width, length, and height from 2 µm to 1000 µm (e.g., 2 µm to 5 µm, 5 µm to 10 µm, 10 µm to 20 µm, 20 µm to 50 µm, 50 µm to 100 µm, 100 µm to 250 µm, 250 µm to 500 µm, or 500 µm to 1000 µm). In some embodiments, devices 14 can have a doped or undoped semiconductor substrate thickness of 2 µm to 50 µm (e.g., 2 µm to 5 µm, 5 µm to 10 µm, 10 µm to 20 µm, or 20 µm to 50 µm). Devices 14 can be integrated circuits with a length greater than width, for example having an aspect ratio greater than or equal to 2 (e.g., at least 4, 8, 10, 20, or 50) and device contact pads 16 that are adjacent to the ends of transfer-printable devices 14 along the length of the transfer-printable devices 14.

A micro-transfer printable device 14 can be an active electrical component, for example including one or more active elements such as electronic transistors or diodes. Transfer-printable devices 14 can be electronic processors, controllers, drivers, light-emitters, sensors, light-control devices, or light-management devices. Transfer-printable devices 14 can be integrated circuits, for example CMOS integrated circuits made on or in a silicon semiconductor source substrate (e.g., a wafer), light-emitting diodes (LEDs) or lasers, for example made on or in a GaN semiconductor source substrate (a wafer), or silicon photodiodes. Transfer-printable device 14 can be a passive component, for example including one or more passive elements such as resistors, capacitors, or conductors such as electrical jumpers. In some embodiments, transfer printable device 14 is a compound micro-transfer printable device 14 that includes one or more of both active and passive elements or circuits. Transfer-printable device 14 can be a semiconductor device 14 having one or more semiconductor layers, such as an integrated circuit or chiplet. Transfer-printable device 14 can be an unpackaged die. In some embodiments, transfer-printable device 14 is a compound element including a plurality of active elements, a plurality of passive elements, or both active and passive element(s), such as multiple semiconductor devices 14 with separate substrates, for example each with one or more active elements or passive elements, or both. In certain embodiments, the plurality of elements is disposed and interconnected on a compound-element substrate (e.g., rigid substrate 18) separate from the substrates of any semiconductor devices 14 or a different substrate (e.g., intermediate substrate 20 or flexible substrate 30). The compound element can be transfer printed itself after the elements have been arranged and interconnected thereon.

Printable component structures can be made in a semiconductor source substrate (e.g., a silicon or GaN wafer) having a process side and a back side used to handle and transport the wafer. Transfer-printable devices 14 can be formed using lithographic processes in an active layer on or in the process side of a source substrate. An empty release layer space (sacrificial portion) is formed beneath transfer-printable devices 14 with device tethers 61 connecting transfer-printable devices 14 to anchors on the source substrate in such a way that pressure applied against transfer-printable devices 14 breaks device tethers 61 to release transfer-printable devices 14 from the source substrate (e.g., with a stamp such as a visco-elastic PDMS stamp). Methods of forming such structures are described, for example, in U.S. Pat. No. 8,889,485. Lithographic processes for forming transfer-printable devices 14 in a source substrate, for example transistors, wires, and capacitors, are found in the integrated circuit art.

According to some embodiments of the present disclosure, a source substrate can be a source wafer, for example a semiconductor wafer such as a crystalline silicon or compound semiconductor wafer, or a glass, sapphire, quartz, or polymer substrate or any substrate material capable of supporting transfer-printable devices 14. Micro-structured stamps (e.g., elastomeric stamps, visco-elastic stamps, PDMS stamps, vacuum stamps, electrostatic stamps, or hybrid elastomeric/electrostatic stamps) can be used to pick up devices 14 from a source substrate, transport devices 14 to target intermediate substrate 20, and print devices 14 or rigid structures 10 onto target intermediate substrate 20. When printing devices 14 onto conductor 40 on intermediate substrate 20, as intended herein devices 14 are also printed onto intermediate substrate 20. In some embodiments, surface adhesion forces are used to control the selection and printing of devices 14 onto intermediate substrate 20. In some embodiments, other forces adhere devices 14 to a stamp, for example electro-static, vacuum, or magnetic forces. This process may be performed massively in parallel. Stamps can be designed to transfer a single device 14 or rigid structures 10 or hundreds to thousands of discrete devices 14 structures 10 in a single pick-up and print operation. For a discussion of micro-transfer printing generally, see U.S. Pat. Nos. 7,622,367 and 8,506,867, each of which is hereby incorporated by reference in its entirety. Stamps can be constructed by photolithographically defining a master mold against which liquid material (e.g., PDMS) is cast and solidified to form a stamp. The stamp is then removed from the master mold. A stamp can have a rigid back to which a stamp body is adhered, for example a transparent rigid back comprising glass, on an opposite side of the stamp body from which stamp posts extend.

According to various embodiments of the present invention, a native source substrate (source wafer) can be provided with the transfer-printable device 14, sacrificial portions, and device tethers 61 (or rigid structure tethers 60) already formed, or they can be constructed as part of the process of the present disclosure.

Source substrates and transfer-printable devices 14, stamps, intermediate substrates 20, and flexible substrates 30 can be made separately and at different times or in different temporal orders or locations and provided in various process states.

In comparison to thin-film manufacturing methods, using densely populated source substrates and transferring micro-transfer printable devices 14 to a target intermediate substrate 20 that requires only a sparse array of micro-transfer printable devices 14 located thereon with a stamp does not waste or require active layer material on intermediate substrate 20. Transfer-printable devices 14 made with crystalline semiconductor materials that have higher performance than thin-film active components that might otherwise be disposed on intermediate substrate 20 can be used, for example by transfer printing them. Furthermore, the flatness, smoothness, chemical stability, and heat stability requirements for intermediate substrate 20 used in some embodiments of the present disclosure may be reduced because the adhesion and transfer process is not substantially limited by the material properties of intermediate substrate 20. Manufacturing and material costs may be reduced because of high utilization rates of more expensive materials (e.g., source substrate) and reduced material and processing requirements for intermediate substrate 20.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously. The disclosure has been described in detail with particular reference to certain embodiments thereof, but it will be understood that variations and modifications can be effected within the spirit and scope of the claimed invention.

PARTS LIST

A cross section line
L length direction
W width direction
T1 first thickness
T2 second thickness
10 rigid structure/first rigid structure
12 dielectric structure
14 device/semiconductor integrated-circuit device
16 contact pad
17 spike
18 rigid substrate
20 intermediate substrate/first intermediate substrate
21 intermediate substrate body
22 protrusion/extension
30 flexible substrate
32 power supply
34 first flexible layer
36 second flexible layer
40 conductor
40A first conductor
40B second conductor
44 connection post
46 device electrode
50 second intermediate substrate
52 second rigid structure
54 void
56 third intermediate substrate
60 rigid-structure tether
61 device tether
70 light
80 adhesive
99 variable-stiffness module
100 provide rigid structure step
110 provide intermediate substrate step
120 provide flexible substrate step
130 dispose rigid structure on intermediate substrate step
135 dispose rigid structure on conductor and intermediate and flexible substrates step
140 dispose rigid and intermediate substrates on flexible substrate step
145 dispose intermediate substrate on flexible substrate step
150 dispose conductor on rigid structure and intermediate and flexible substrates step
155 dispose conductor on intermediate and flexible substrates step
160 connect conductor to rigid structure step

What is claimed:

1. A variable-stiffness module, comprising:
a rigid structure having a first stiffness;
an intermediate substrate having a second stiffness less than the first stiffness, wherein the rigid structure is disposed on the intermediate substrate;
a flexible substrate having a third stiffness less than the second stiffness, wherein the intermediate substrate is disposed on the flexible substrate; and
a conductor disposed partially on the intermediate substrate and partially on the flexible substrate and connected to the rigid structure, the conductor extending from the rigid structure to the intermediate substrate to the flexible substrate,
wherein the intermediate substrate has a different thickness than the flexible substrate and/or the intermediate substrate comprises a different material composition than the flexible substrate, and
wherein the conductor is disposed on a side of the intermediate substrate opposite the flexible substrate.

2. The variable-stiffness module of claim 1, wherein the conductor is an electrical conductor.

3. A method of making a variable-stiffness module, comprising:
providing a rigid structure having a first stiffness;
providing an intermediate substrate having a second stiffness less than the first stiffness;
providing a flexible substrate having a third stiffness less than the second stiffness;

disposing the rigid structure on the intermediate substrate and disposing the intermediate substrate on the flexible substrate;

disposing a conductor partially on the intermediate substrate and partially on the flexible substrate; and connecting the rigid structure to the conductor so that the conductor extends from the rigid structure to the intermediate substrate to the flexible substrate, wherein the intermediate substrate has a different thickness than the flexible substrate and/or the intermediate substrate comprises a different material composition than the flexible substrate, and wherein the conductor is disposed on a side of the intermediate substrate opposite the flexible substrate.

4. A variable-stiffness module, comprising:

a rigid structure having a first stiffness;

an intermediate substrate having a variable stiffness, wherein a portion of the intermediate substrate has a local stiffness less than the first stiffness, wherein the rigid structure is disposed on the portion of the intermediate substrate;

a flexible substrate having a third stiffness less than the variable stiffness, wherein the intermediate substrate is disposed on the flexible substrate; and a conductor disposed on the rigid structure and on the intermediate substrate, the conductor extending from the rigid structure to the intermediate substrate, and wherein the conductor is disposed on a side of the intermediate substrate opposite the flexible substrate.

5. A module, comprising:

a rigid structure having a first stiffness;

an intermediate substrate having a second stiffness less than the first stiffness, wherein the rigid structure is disposed on the intermediate substrate;

a flexible substrate having a third stiffness less than or equal to the second stiffness, wherein the intermediate substrate is disposed on the flexible substrate and the rigid structure is disposed at least partially between the intermediate substrate and the flexible substrate; and a conductor disposed at least partially on the flexible substrate and connected to the rigid structure, wherein the intermediate substrate has a different thickness than the flexible substrate and/or the intermediate substrate comprises a different material composition than the flexible substrate, and wherein the conductor is disposed on a side of the intermediate substrate opposite the flexible substrate.

6. A variable-stiffness module, comprising:

a rigid structure having a first stiffness;

an intermediate substrate having a second stiffness less than the first stiffness, wherein the rigid structure is disposed on the intermediate substrate;

a flexible substrate having a third stiffness less than the second stiffness, wherein the intermediate substrate is disposed on the flexible substrate; and a conductor disposed partially on the intermediate substrate and partially on the flexible substrate and connected to the rigid structure, the conductor extending from the rigid structure to the intermediate substrate to the flexible substrate, wherein the intermediate substrate comprises a protrusion that extends from an intermediate substrate body in a direction in which the conductor extends.

7. A variable-stiffness module, comprising:

a rigid structure having a first stiffness;

an intermediate substrate having a second stiffness less than the first stiffness, wherein the rigid structure is disposed on the intermediate substrate;

a flexible substrate having a third stiffness less than the second stiffness, wherein the intermediate substrate is disposed on the flexible substrate; and a conductor disposed partially on the intermediate substrate and partially on the flexible substrate and connected to the rigid structure, the conductor extending from the rigid structure to the intermediate substrate to the flexible substrate, wherein the intermediate substrate has a different thickness than the flexible substrate and/or the intermediate substrate comprises a different material composition than the flexible substrate, and wherein the intermediate substrate is a first intermediate substrate and the module further comprises a second intermediate substrate having a fourth stiffness less than the second stiffness and greater than the third stiffness, wherein the second intermediate substrate is disposed on the flexible substrate and the first intermediate substrate is disposed on the second intermediate substrate, and wherein the conductor extends from the first intermediate substrate to the second intermediate substrate to the flexible substrate, wherein the first intermediate substrate has a different thickness than the second intermediate substrate and/or the first intermediate substrate comprises a different material composition than the second intermediate substrate.

8. A variable-stiffness module, comprising:

a rigid structure having a first stiffness;

an intermediate substrate having a second stiffness less than the first stiffness, wherein the rigid structure is disposed on the intermediate substrate;

a flexible substrate having a third stiffness less than the second stiffness, wherein the intermediate substrate is disposed on the flexible substrate; and a conductor disposed partially on the intermediate substrate and partially on the flexible substrate and connected to the rigid structure, the conductor extending from the rigid structure to the intermediate substrate to the flexible substrate, wherein the intermediate substrate has a different thickness than the flexible substrate and/or the intermediate substrate comprises a different material composition than the flexible substrate, and wherein the rigid structure is a first rigid structure and the module further comprises a second rigid structure having a fourth stiffness greater than at least one of the second stiffness and the third stiffness, wherein the second rigid structure is disposed on the flexible substrate, and wherein the conductor extends from the first rigid structure to the second rigid structure.

9. The variable-stiffness module of claim 8, wherein the first rigid structure and the second rigid structure are disposed on the intermediate substrate.

10. A variable-stiffness module, comprising:

a rigid structure having a first stiffness;

an intermediate substrate having a second stiffness less than the first stiffness, wherein the rigid structure is disposed on the intermediate substrate;

a flexible substrate having a third stiffness less than the second stiffness, wherein the intermediate substrate is disposed on the flexible substrate; and a conductor disposed partially on the intermediate substrate and partially on the flexible substrate and connected to the rigid structure, the conductor extending from the rigid structure to the intermediate substrate to the flexible substrate, wherein the intermediate substrate has a different thickness than the flexible substrate and/or the intermediate substrate comprises a different material composition than the flexible substrate, and wherein the rigid structure is disposed at least partly between the conductor and the flexible substrate.

11. A variable-stiffness module, comprising:

a rigid structure having a first stiffness;

an intermediate substrate having a second stiffness less than the first stiffness, wherein the rigid structure is disposed on the intermediate substrate;

a flexible substrate having a third stiffness less than the second stiffness, wherein the intermediate substrate is disposed on the flexible substrate; and a conductor disposed partially on the intermediate substrate and partially on the flexible substrate and connected to the rigid structure, the conductor extending from the rigid structure to the intermediate substrate to the flexible substrate, wherein the intermediate substrate has a different thickness than the flexible substrate and/or the intermediate substrate comprises a different material composition than the flexible substrate, and wherein the intermediate substrate has a variable stiffness, the flexible substrate has a variable stiffness, or both the intermediate substrate and the flexible substrate have a variable stiffness.

12. The variable-stiffness module of claim 11, wherein the one or more of the intermediate substrate and the flexible substrate has one or more of a variable thickness, a variable material quantity, a variable material composition, and a variable material density.

13. A variable-stiffness module, comprising:

a rigid structure having a first stiffness;

an intermediate substrate having a second stiffness less than the first stiffness, wherein the rigid structure is disposed on the intermediate substrate;

a flexible substrate having a third stiffness less than the second stiffness, wherein the intermediate substrate is disposed on the flexible substrate; and a conductor disposed partially on the intermediate substrate and partially on the flexible substrate and connected to the rigid structure, the conductor extending from the rigid structure to the intermediate substrate to the flexible substrate, wherein the intermediate substrate has a different thickness than the flexible substrate and/or the intermediate substrate comprises a different material composition than the flexible substrate, and wherein the conductor is a first conductor and the module comprises a second conductor, the second conductor connected to the rigid structure and extending from the rigid structure to the intermediate substrate to the flexible substrate, (i) wherein the second conductor is disposed at least partially on a side of the rigid structure opposite the first conductor, (ii) wherein the second conductor is disposed at least partially on a same side of the rigid structure as the first conductor, (iii) wherein either one or both of the first and second conductors are disposed at least partially between the rigid structure and the intermediate substrate, or (iv) wherein either one or both of the first and second conductors are disposed at least partially on a same side of the rigid structure opposite the intermediate substrate.

14. A variable-stiffness module, comprising:

a rigid structure having a first stiffness;

an intermediate substrate having a second stiffness less than the first stiffness, wherein the rigid structure is disposed on the intermediate substrate;

a flexible substrate having a third stiffness less than the second stiffness, wherein the intermediate substrate is disposed on the flexible substrate; and a conductor disposed at least partially on the flexible substrate and connected to the rigid structure, wherein the intermediate substrate has a different thickness than the flexible substrate and/or the intermediate substrate comprises a different material composition than the flexible substrate, and wherein the intermediate substrate is a first intermediate substrate and the module further comprises a second intermediate substrate having a fourth stiffness less than the second stiffness and greater than the third stiffness, wherein the second intermediate substrate is disposed at least partially between the flexible substrate and the first intermediate substrate, wherein the first intermediate substrate has a different thickness than the second intermediate substrate and/or the first intermediate substrate comprises a different material composition than the second intermediate substrate.

15. The variable-stiffness module of claim 14, wherein the first intermediate substrate extends over a first portion of the flexible substrate, the second intermediate substrate extends over a second portion of the flexible substrate, and the first portion extends beyond the second portion over a portion of the flexible substrate.

* * * * *